(12) United States Patent
Shajii et al.

(10) Patent No.: US 10,424,460 B2
(45) Date of Patent: Sep. 24, 2019

(54) SYSTEMS, METHODS AND APPARATUS FOR CHOKED FLOW ELEMENT EXTRACTION

(71) Applicant: Lam Research Corporation, Fremont, CA (US)

(72) Inventors: Ali Shajii, Weston, MA (US); Richard Gottscho, Dublin, CA (US); Souheil Benzerrouk, Hudson, NH (US); Andrew Cowe, Andover, MA (US); Siddharth P. Nagarkatti, Acton, MA (US); William R. Entley, Wakefield, MA (US)

(73) Assignee: Lam Research Corporation, Fremont, CA (US)

( * ) Notice: Subject to any disclaimer, the term of this patent is extended or adjusted under 35 U.S.C. 154(b) by 360 days.

(21) Appl. No.: 15/243,815

(22) Filed: Aug. 22, 2016

(65) Prior Publication Data

US 2016/0358754 A1    Dec. 8, 2016

Related U.S. Application Data

(63) Continuation of application No. 12/852,375, filed on Aug. 6, 2010, now Pat. No. 9,449,793.

(51) Int. Cl.
*H01J 37/32* (2006.01)

(52) U.S. Cl.
CPC ...... *H01J 37/32174* (2013.01); *H01J 37/321* (2013.01); *H01J 37/3244* (2013.01); *H01J 37/3266* (2013.01); *H01J 37/32467* (2013.01); *H01J 37/32642* (2013.01); *H01J 2237/334* (2013.01)

(58) Field of Classification Search
CPC ................ H01J 37/321; H01J 37/3266; H01J 37/32174; H01J 37/32467; H01J 37/32642; H01J 37/3244; H01J 2237/334
See application file for complete search history.

(56) References Cited

U.S. PATENT DOCUMENTS

| 7,314,574 B2 | 1/2008 | Ichiki et al. .................... 216/67 |
| 7,952,048 B2 | 5/2011 | Choi et al. ............... 219/121.57 |
| 2003/0071035 A1* | 4/2003 | Brailove ................ H05B 6/108 219/672 |
| 2003/0232151 A1* | 12/2003 | Vukovic ........... H01J 37/32082 427/571 |
| 2005/0020070 A1 | 1/2005 | Ichiki et al. .................. 438/689 |
| 2005/0035731 A1* | 2/2005 | Secheresse .......... F03H 1/0075 315/500 |
| 2006/0289409 A1 | 12/2006 | Choi et al. ............... 219/121.57 |

(Continued)

FOREIGN PATENT DOCUMENTS

| JP | 11-251091 | 9/1999 | ............... H05H 1/46 |
| KR | 20070079870 | 8/2007 | ......... H01L 21/3065 |
| WO | WO 03/030240 A2 | 10/2003 | ......... H01L 21/3065 |

*Primary Examiner* — Yuechuan Yu
(74) *Attorney, Agent, or Firm* — Penilla IP, APC

(57) ABSTRACT

A plasma source includes a ring plasma chamber, a primary winding around an exterior of the ring plasma chamber, multiple ferrites, wherein the ring plasma chamber passes through each of the ferrites and multiple plasma chamber outlets coupling the plasma chamber to a process chamber. Each one of the plasma chamber outlets having a respective plasma restriction. A system and method for generating a plasma are also described.

14 Claims, 25 Drawing Sheets

(56) References Cited

U.S. PATENT DOCUMENTS

2009/0233384 A1    9/2009  Foad et al. .................. 438/7
2009/0286405 A1  11/2009  Okesaku et al. ............ 438/710
2011/0278260 A1* 11/2011  Lai .................... C23C 16/45565
                                                              216/68

* cited by examiner

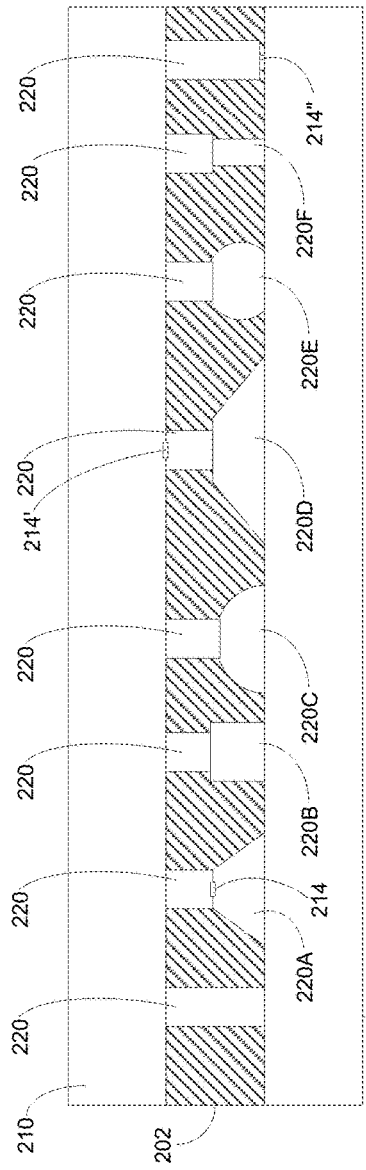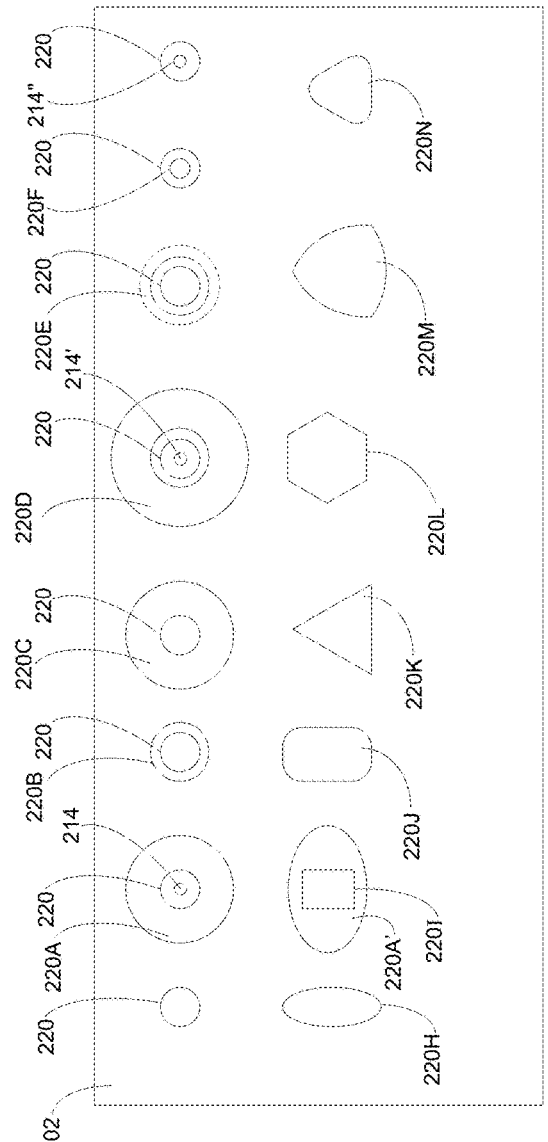
FIG. 2I
FIG. 2J

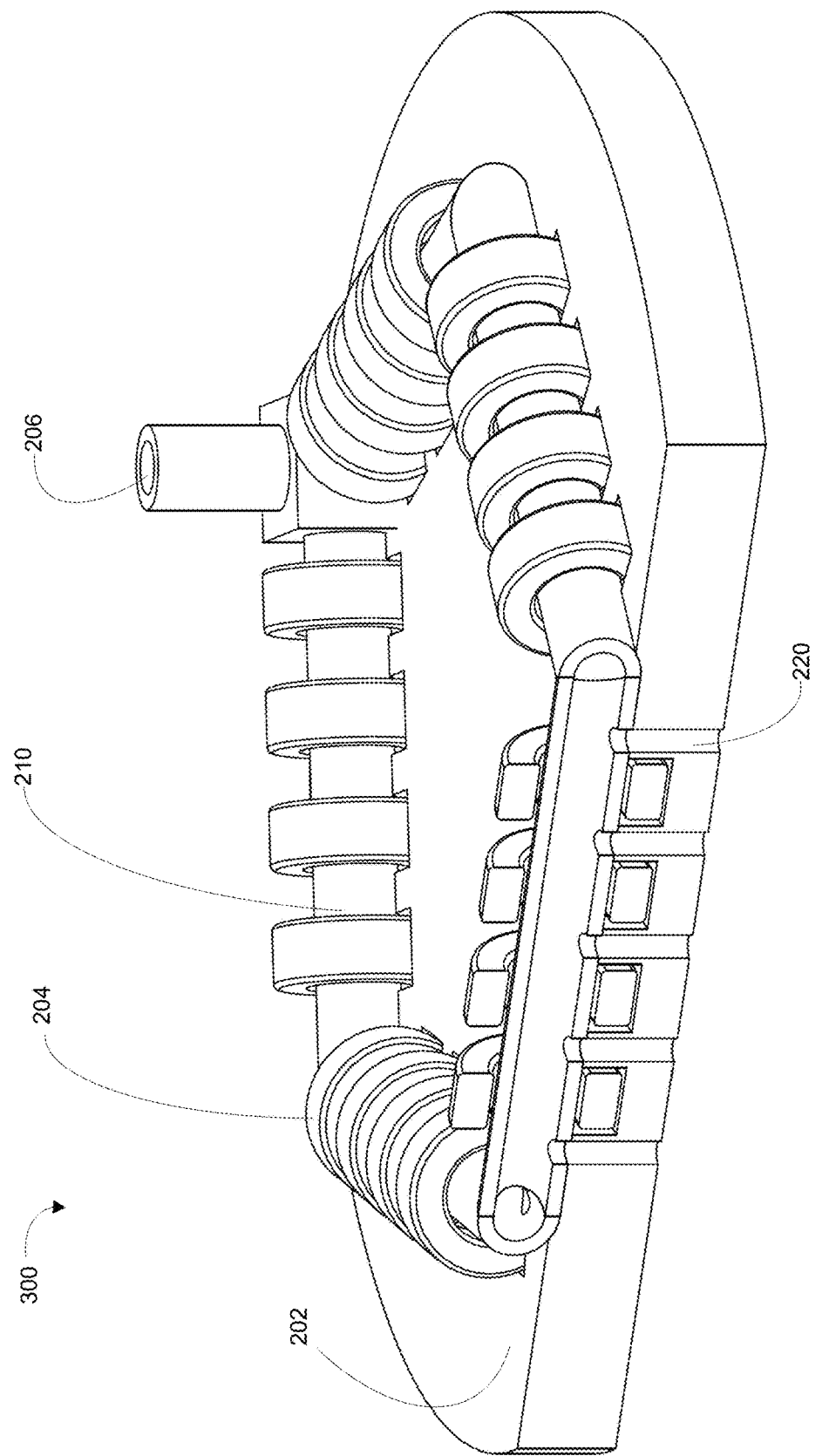

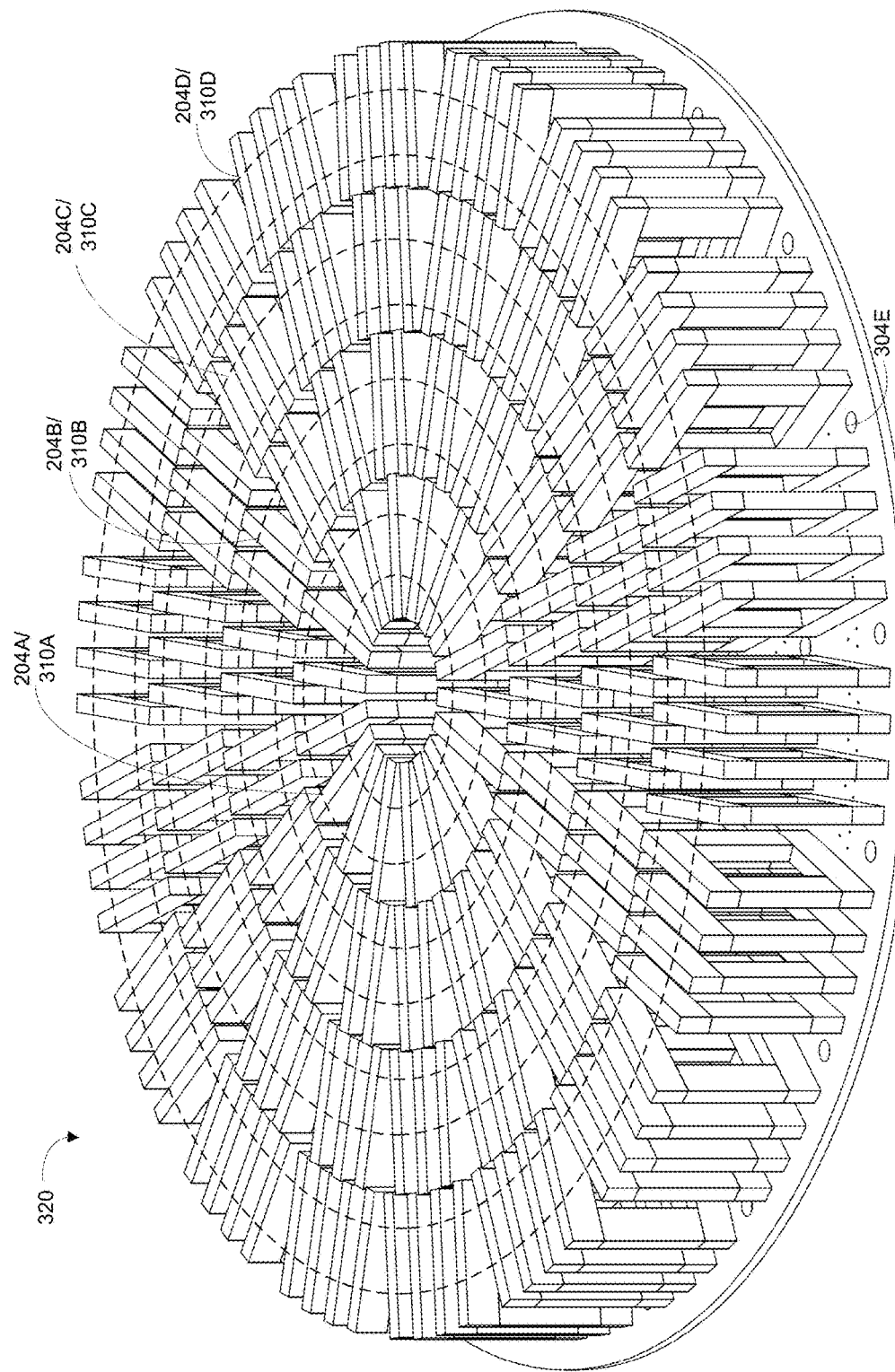

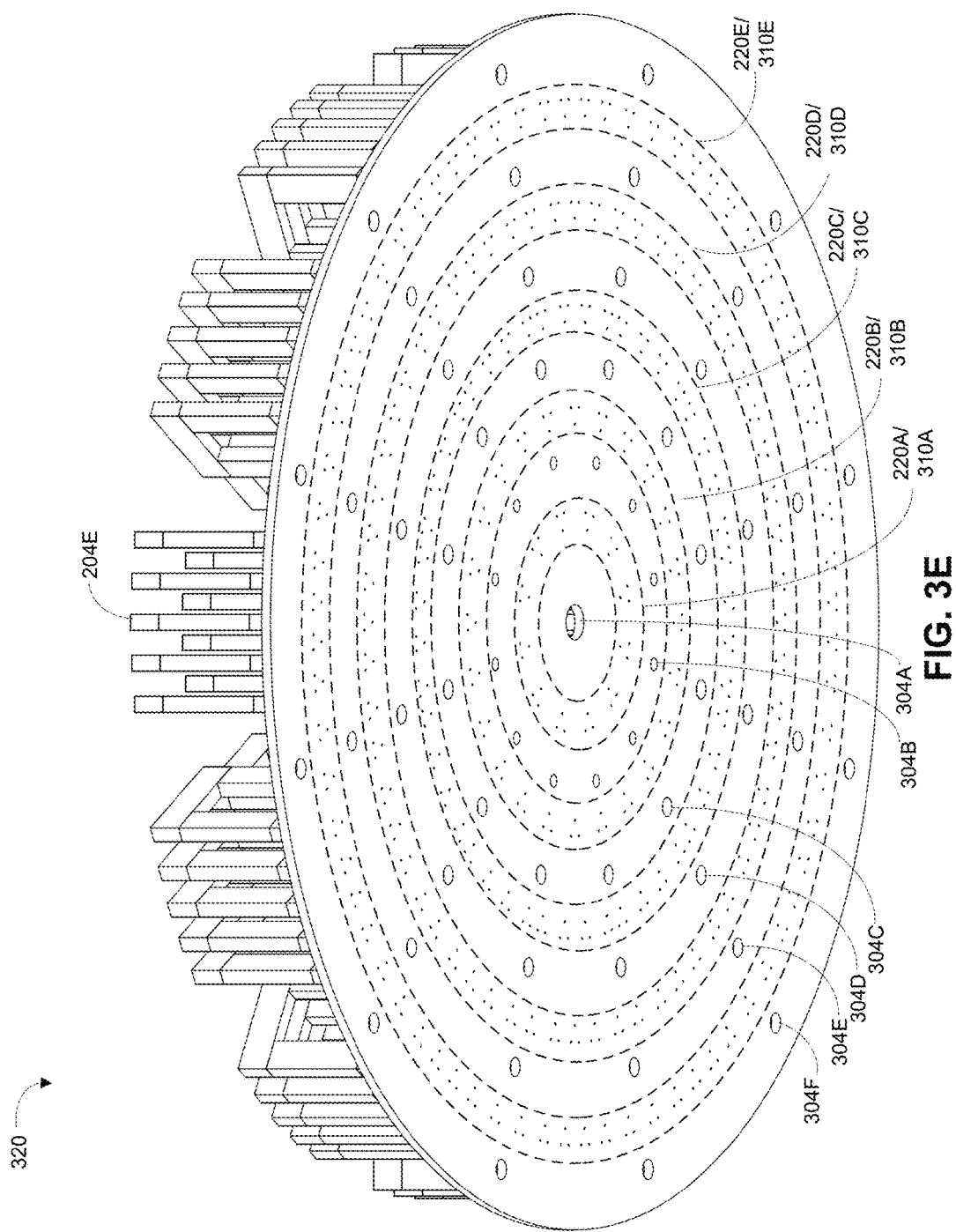

SYSTEMS, METHODS AND APPARATUS FOR CHOKED FLOW ELEMENT EXTRACTION

CLAIM OF PRIORITY

This application is a continuation of U.S. patent application Ser. No. 12/852,375, filed on Aug. 6, 2010, entitled, "Systems, Methods and Apparatus For Choked Flow Element Extraction" which is incorporated herein by reference.

BACKGROUND

The present invention relates generally to plasma reaction chambers, and more particularly, to methods, systems and apparatus for plasma reaction chambers separate from the wafer processing chamber.

FIG. 1A is a side view of a typical parallel-plate, capacitive, plasma processing chamber 100. FIG. 1B is a top view of a substrate 102 processed in the typical parallel-plate, capacitive, plasma processing chamber 100. The typical plasma processes processing chamber 100 includes a top electrode 104, a substrate support 106 for supporting a substrate to be processed 102. The substrate support 106 can also be a bottom electrode. The top electrode 104 is typically a showerhead type electrode with multiple inlet ports 109. The multiple inlet ports 109 allow process gases 110 in across the width of the processing chamber 100.

The typical parallel-plate, capacitive plasma reactor 100 is used for processing round planar substrates. Common processes are dielectric etch and other etch processes. Such plasma reactors typically suffer from inherent center-to-edge non-uniformities of neutral species.

Although these systems work well, some produce center-to-edge non-uniformities of neutral species which arise from the differences in one or more of a flow velocity, an effective gas residence time, and one or more gas chemistries present at the center of the substrate as compared to the flow velocity, effective gas residence time, and one or more gas chemistries present at the edge. The one or more gas chemistries can be caused by gas-phase dissociation, exchange and recombination reactions.

By way of example, as the process gases are introduced across the width of the processing chamber the plasma 112 is formed between the top electrode 104 and bottom electrode 106 and the plasma is formed. Plasma byproducts 118 are formed by the reaction of radicals and neutrals in the plasma 112 with the surface of the substrate 102. The plasma byproducts 118 are drawn off to the sides of the substrate and into pumps 108. Plasma byproducts can include one or more dissociation reactions (e.g., $CF_4+e^- \rightarrow CF_3+F+e^-$) and/or one or more ionizations (e.g., $CF_4+e^- \rightarrow CF_3^++F$) and/or one or more excitations (e.g., $Ar \rightarrow Ar^++e^-$) and/or one or more attachments (e.g., $CF_4+e^- \rightarrow CF_3+F^-$) and/or one or more binary reactions (e.g., $CF_3+H \rightarrow CF_2+HF$).

Plasma byproducts 118 can also include etch byproducts including the etchant, F, CFx, SiF2, SiF4, Co, CO2. Etch byproducts can also dissociate in the plasma 112.

Recombination also occurs during the plasma processing. Recombination produces recombination products 120. Recombination typically occurs when the radicals and neutrals from the plasma 112 impact surfaces such as the bottom surface of the top electrode 104. The recombination products 120 are then drawn off the side of the substrate 102 into pumps 108, similar to the plasma byproducts 118. Plasma recombination products 120 can include one or more wall or surface reactions (e.g., $F+CF \rightarrow CF_2$, and/or $H+H \rightarrow H_2$, and/or $O+O \rightarrow O_2$, and/or $N+N \rightarrow N_2$). Plasma recombination products 120 can also include deposition where CFx forms a polymer on the wall or other internal surface of the chamber 100.

It should be noted that as shown in FIG. 1A, the plasma byproducts are drawn off one side of the substrate 102 and the recombination products 120 are drawn off the opposite side of the substrate 102 for clarity purposes only. In actual practice, those skilled in the art would realize that both the recombination products 120 and the plasma byproducts 118 are intermixed and drawn off both sides of the substrate 102 to pumps 108 or other means.

As the plasma processing occurs, concentrations of the recombination products 120 and the plasma byproducts 118 vary from the center to the edge of the substrate 102. As a result, the concentrations of the process gases, radicals and neutral species in the plasma 112 also correspondingly vary. Thus, the effective plasma processing, etch in this instance, varies from the center to the edge of the substrate 102. There are, however, a number of chamber configurations and structures that can be implemented to reduce or control the plasma.

With such controls, the plasma radicals and neutral species are most concentrated at the center of the substrate 102 in plasma processing regions 114A and 116A over central portion 102A of the substrate 102. Further, the concentrations of the radicals and neutral species are somewhat less concentrated in intermediate plasma processing regions one 114B and 116B over intermediate portion 102B of the substrate 102. Further still, the concentrations of the radicals and neutral species are further diluted and less concentrated in edge plasma processing regions 114C and 116C over the edge portion 102C of the substrate 102.

Thus, plasma processing occurs fastest in the center plasma processing regions 114A and 116A over the center portion 102A of substrate 102 as compared to the plasma processing that occurs slightly slower in the intermediate plasma processing regions 114B and 116B over the intermediate portion 102B of substrate 102 and even slower in the plasma processing of the edge plasma processing regions 114C and 116C over the edge portion 102C of the substrate. This results in a center-to-edge nonuniformity of the substrate 102.

This center-to-edge nonuniformity is exacerbated in small volume product plasma processing chambers that have a very large aspect ratio. For example, a very large aspect ratio is defined as when the width W of the substrate is about four or more or more times the height H of the plasma processing region. The very large aspect ratio of the plasma processing region further concentrates the plasma byproducts 118 and recombination products 120 in the plasma processing regions 114A-116C.

Although this center-to-edge non-uniformity of neutral species is not the only cause of center-to-edge process uniformity, in many dielectric etch applications it is a significant contributor. Specifically, neutral-dependent processes such as gate or bitline mask open, photoresist strip over low-k films, highly selective contact/cell and via etch may be especially sensitive to these effects. Similar problems may apply in other parallel-plate plasma reactors, besides those used for wafer dielectric etch.

In view of the foregoing, there is a need for improving the center-to-edge uniformity in plasma etch processes.

SUMMARY

Broadly speaking, the present invention fills these needs by providing a distributed multi-zone plasma source. It should be appreciated that the present invention can be implemented in numerous ways, including as a process, an apparatus, a system, computer readable media, or a device. Several inventive embodiments of the present invention are described below.

One embodiment provides a plasma source includes a ring plasma chamber, a primary winding around an exterior of the ring plasma chamber, multiple ferrites, wherein the ring plasma chamber passes through each of the ferrites and multiple plasma chamber outlets coupling the plasma chamber to a process chamber. Each one of the plasma chamber outlets having a respective plasma restriction.

The plasma restriction can have a diameter of between about 0.1 mm and about 2.0 mm. The plasma restriction can have a diameter less than or equal to twice a plasma sheath thickness. The plasma restriction can have a diameter sufficient to provide a pressure differential greater than about 1.5 to 1 between the plasma chamber and a process chamber. The plasma restriction can be coupled to a bias supply.

The plasma source can include at least one process gas inlet coupling a process gas source to the plasma chamber. The plasma source can also include a process gas flow rate control device coupled to the at least one process gas inlet.

The ferrites can be substantially evenly distributed around the circumference of the ring plasma chamber. The ferrites can be grouped in groups around the circumference of the ring plasma chamber. The ring plasma chamber can be one of a group of shapes consisting of substantially round, substantially triangular, substantially rectangular, or substantially polygonal shape.

Another embodiment provides a method of generating a plasma. The method includes delivering a process gas into a ring plasma chamber, applying a primary current to a primary winding around the exterior of the ring plasma chamber, generating magnetic field in the primary winding, concentrating the magnetic field with multiple ferrites. The ring plasma chamber passes through each of the ferrites. A secondary current is induced in the process gas in the ring plasma chamber and a plasma is generated in the process gas in the ring plasma chamber with the secondary current. The plasma is restricted in the ring plasma chamber with a plasma restriction in each of multiple plasma chamber outlets coupling the plasma chamber to a process chamber.

The method can also include delivering at least one of a neutral species and a radical species to a process chamber through the outlet ports. The plasma restriction can also be biased.

The method can also include modulating at least one of a flow rate, a pressure and/or a bias in the ring plasma chamber. The method can also include receiving a process feedback signal from at least one process monitoring sensor and adjusting at least one set point of at least one of a flow rate, a pressure and/or a bias.

Another embodiment provides a plasma processing system including a ring plasma chamber, a primary winding around an exterior of the ring plasma chamber, multiple ferrites, wherein the ring plasma chamber passes through each of the ferrites. Multiple plasma chamber outlets couple the plasma chamber to a process chamber, each one of the plasma chamber outlets having a respective plasma restriction. The system also includes at least one process monitoring sensor and a controller. The controller includes logic for delivering a process gas into the ring plasma chamber, logic for applying a primary current to a primary winding around the exterior of the ring plasma chamber,
logic for generating magnetic field in the primary winding, logic for concentrating the magnetic field with the ferrites, logic for inducing a secondary current in the process gas in the ring plasma chamber, logic for generating a plasma in the process gas in the ring plasma chamber with the secondary current, logic for receiving a process feedback signal from at least one process monitoring sensor and logic for adjusting at least one set point.

Yet another embodiment provides a plasma system for processing a substrate. The system includes a process chamber having a base, multiple sidewalls, a substrate support proximate to the base and a chamber top interfaced with the sidewalls to enclose the process chamber. The system also includes multiple ferrites and multiple plasma chamber outlets. The ferrites are disposed over the chamber top, such that the ferrites are distributed over regions of the substrate support, the regions extending at least between an exterior portion of the substrate support and a center portion of the substrate support. The plasma chamber outlets are coupling a plasma chamber to the process chamber, each one of the plasma chamber outlets having a respective plasma restriction. The plasma system can also include a power supply for providing a current along the ferrites, the ferrites concentrating the current over the regions of the substrate support.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 2I shows multiple sectional views of the plasma chamber outlets, in accordance with embodiments of the present invention.

FIG. 2J is a process chamber view of multiple plasma chamber outlets, in accordance with embodiments of the present invention.

FIG. 3A is a perspective view of another plasma source, in accordance with an embodiment of the present invention.

FIG. 3B is a top perspective view of a multizone plasma source, in accordance with an embodiment of the present invention.

FIG. 3E is a bottom perspective view of multizone plasma source, in accordance with an embodiment of the present invention.

DETAILED DESCRIPTION

Several exemplary embodiments for a distributed multizone plasma source system, method and apparatus will now be described. It will be apparent to those skilled in the art that the present invention may be practiced without some or all of the specific details set forth herein.

Figure 1A:
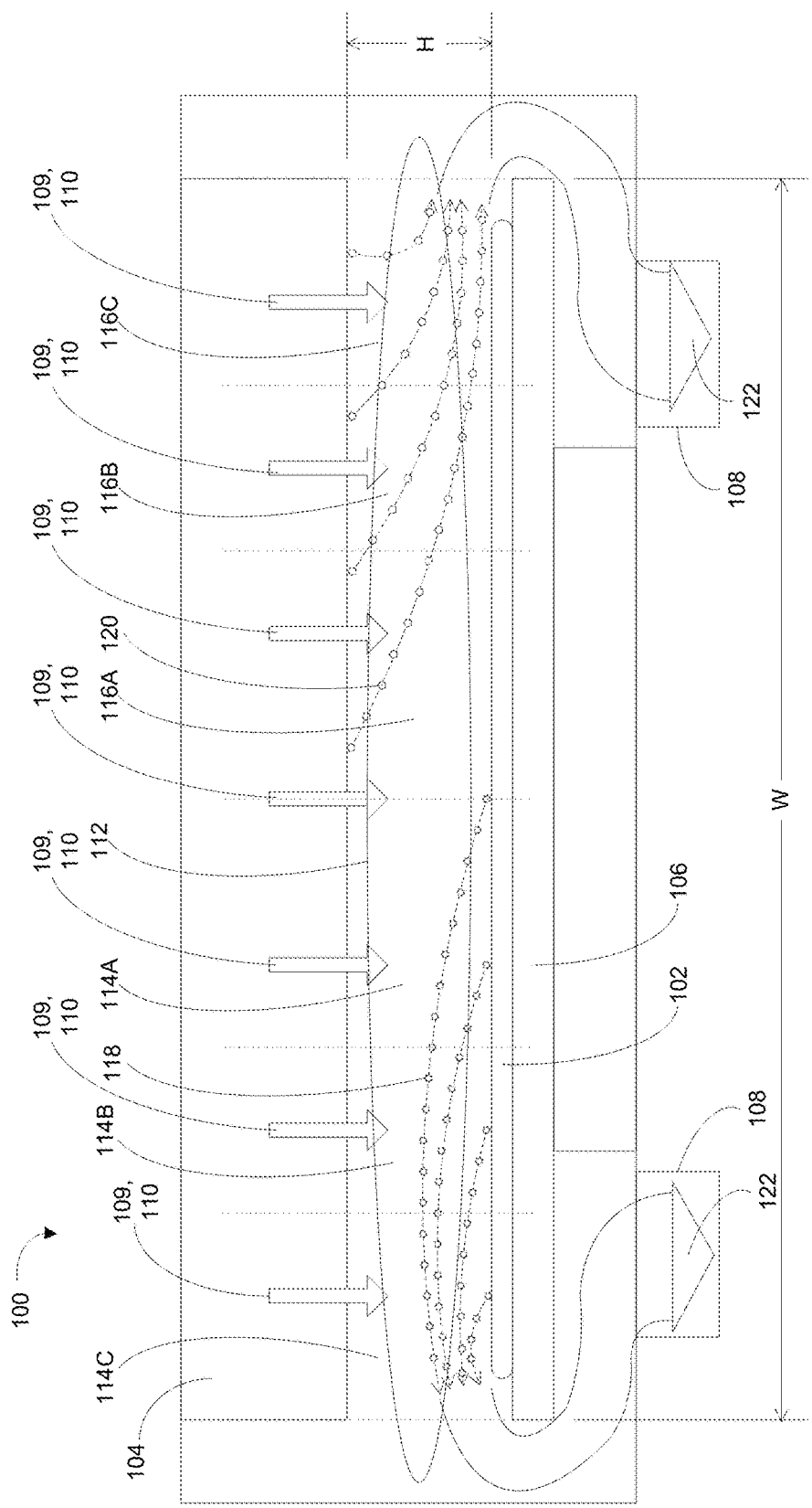
FIG. 1A is a side view of a typical parallel-plate, capacitive, plasma processing chamber.
Figure 1B:
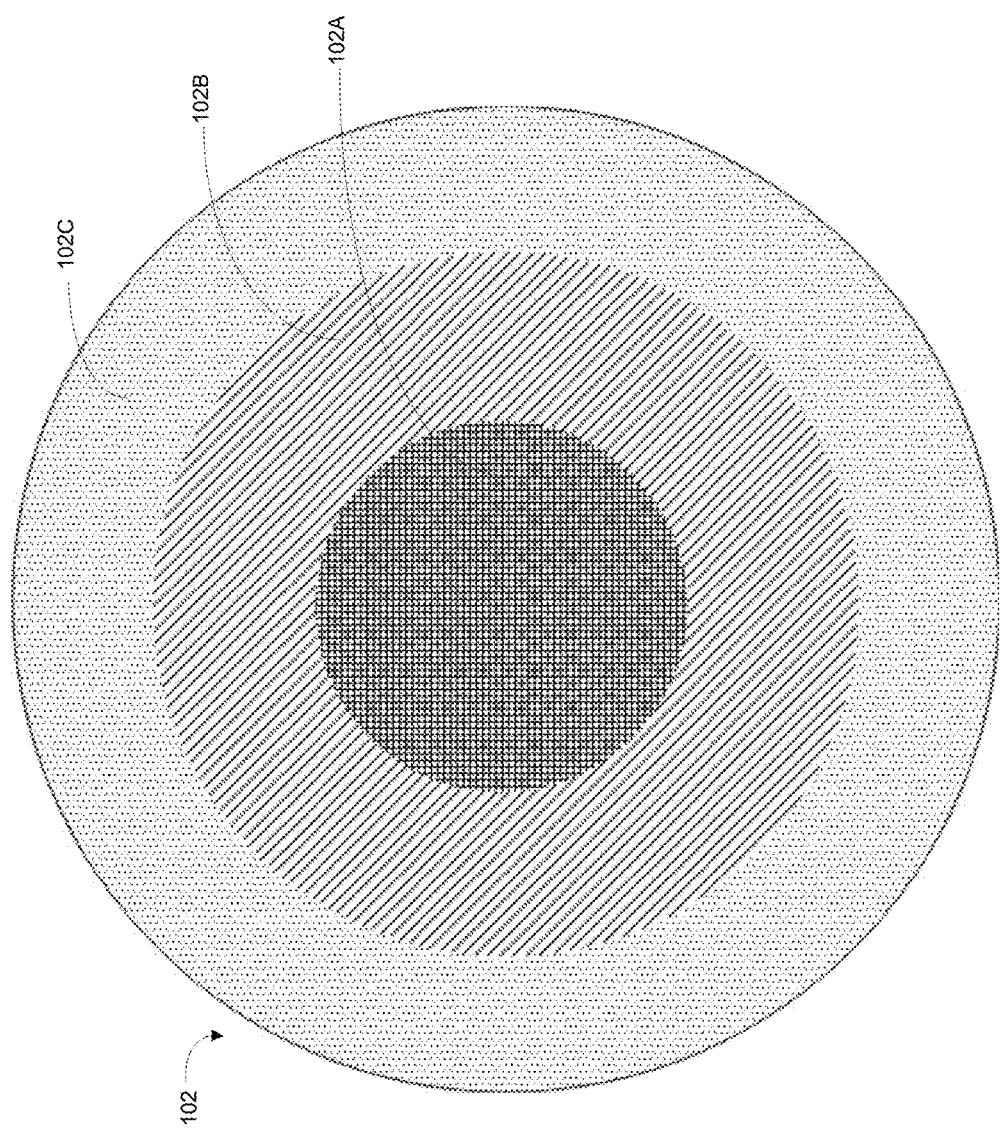
FIG. 1B is a top view of a substrate processed in the typical parallel-plate, capacitive, plasma processing chamber.
Figure 2A:
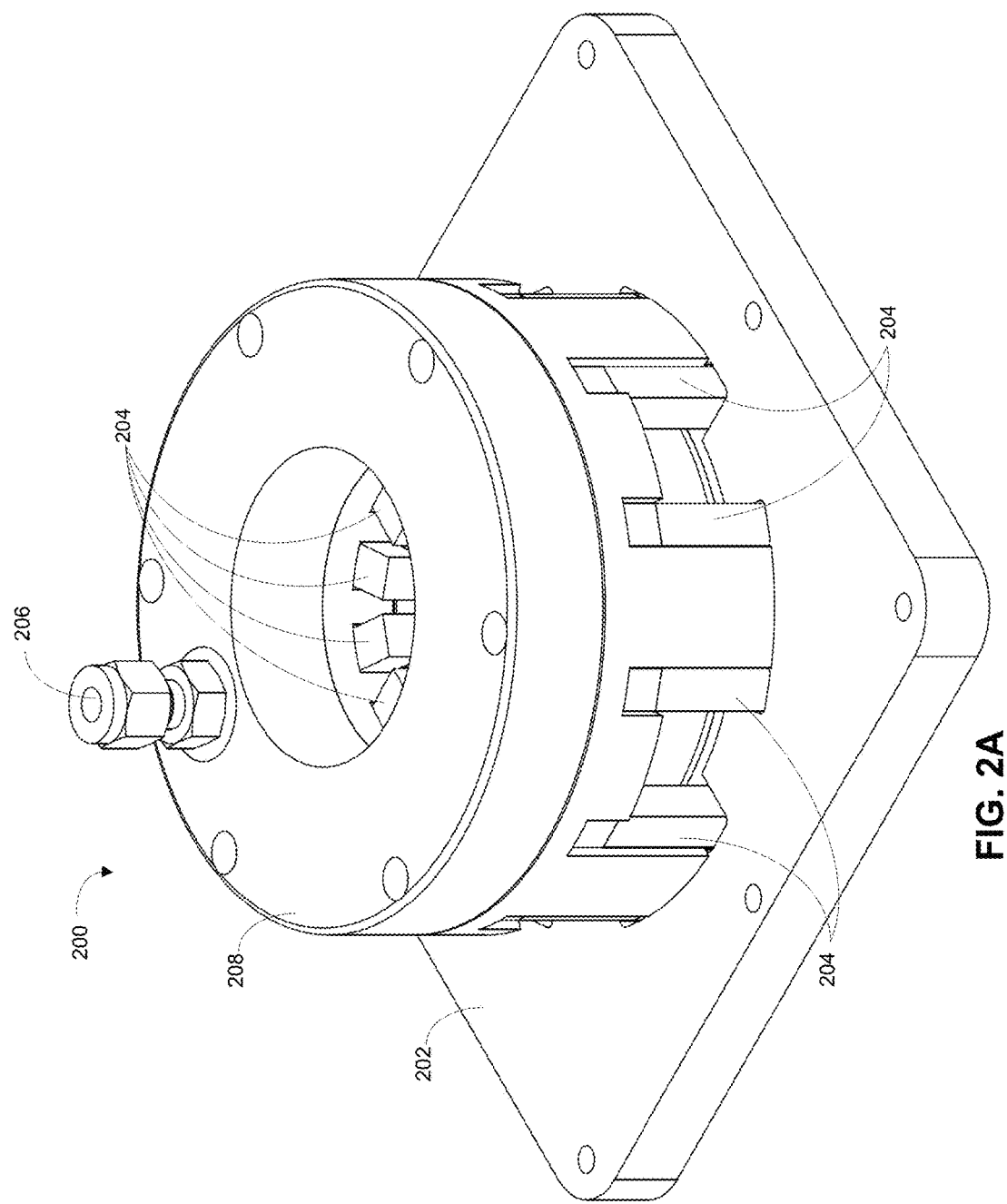
FIG. 2A is a perspective view of a plasma source, in accordance with an embodiment of the present invention.

FIG. 2A is a perspective view of a plasma source 200, in accordance with an embodiment of the present invention. The plasma source 200 includes a process gas inlet 206, multiple ferrites 204, a plasma source top 208 and a chamber top 202. It should be understood that the specific arrangement of the elements 202-208 of the plasma source 200 might be modified from what is shown. For example, the chamber top 202 and the plasma source top 208 could be combined into a single cover of the process chamber 230.

Figure 2B:
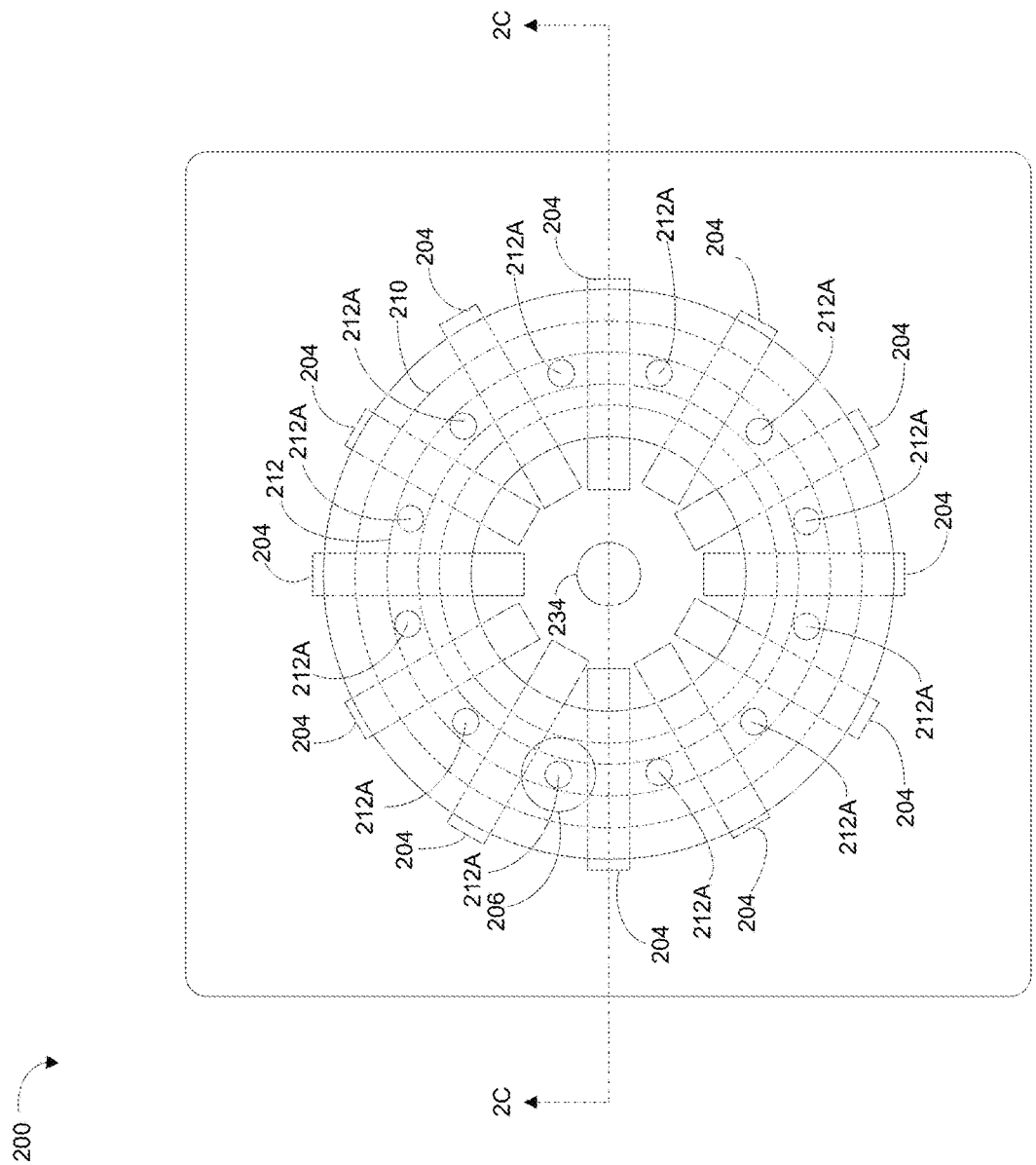
FIG. 2B is a top view of a plasma source, in accordance with an embodiment of the present invention.
Figure 2C:
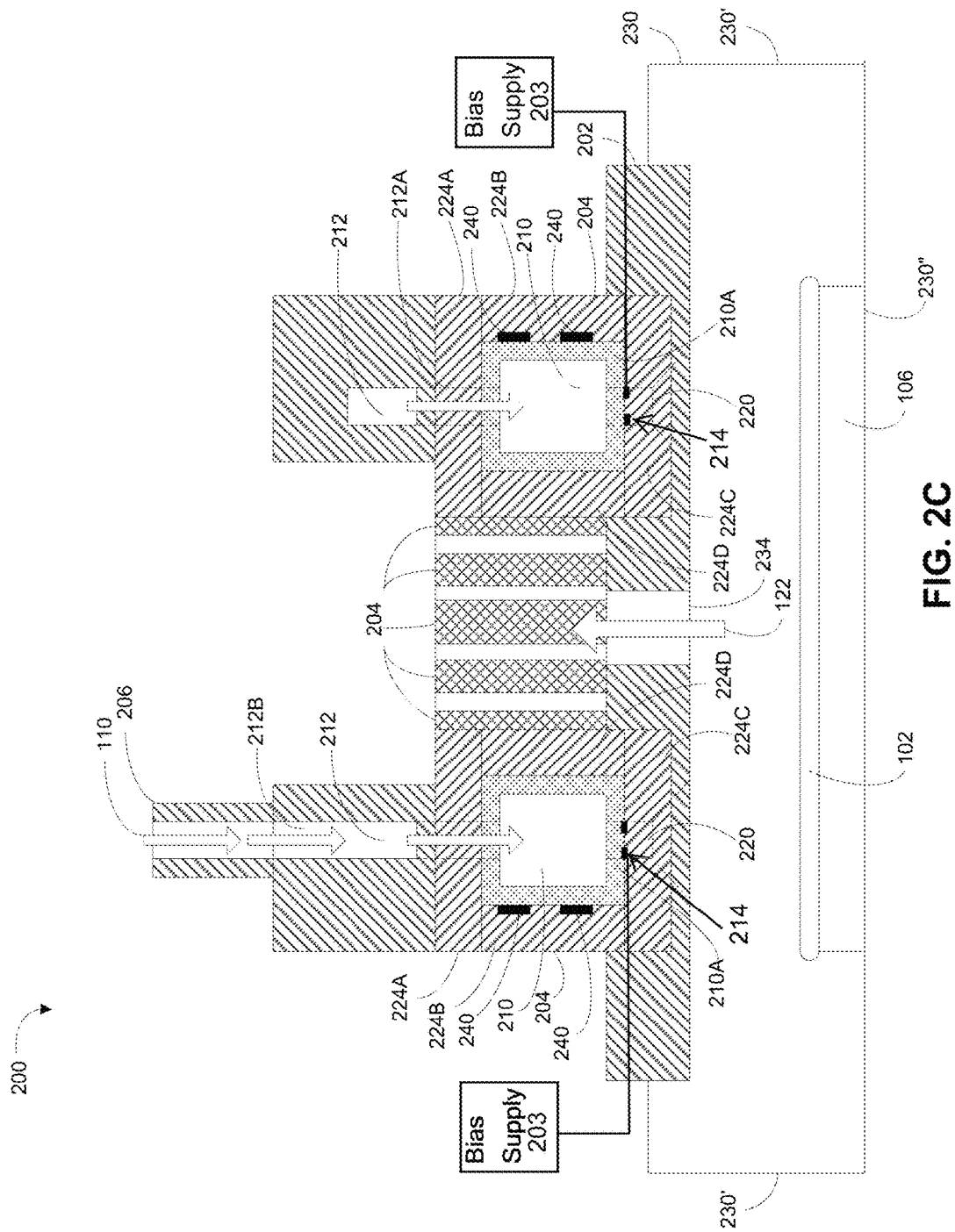
FIG. 2C is a sectional view 2C-2C of a plasma source, in accordance with an embodiment of the present invention.
Figure 2D:
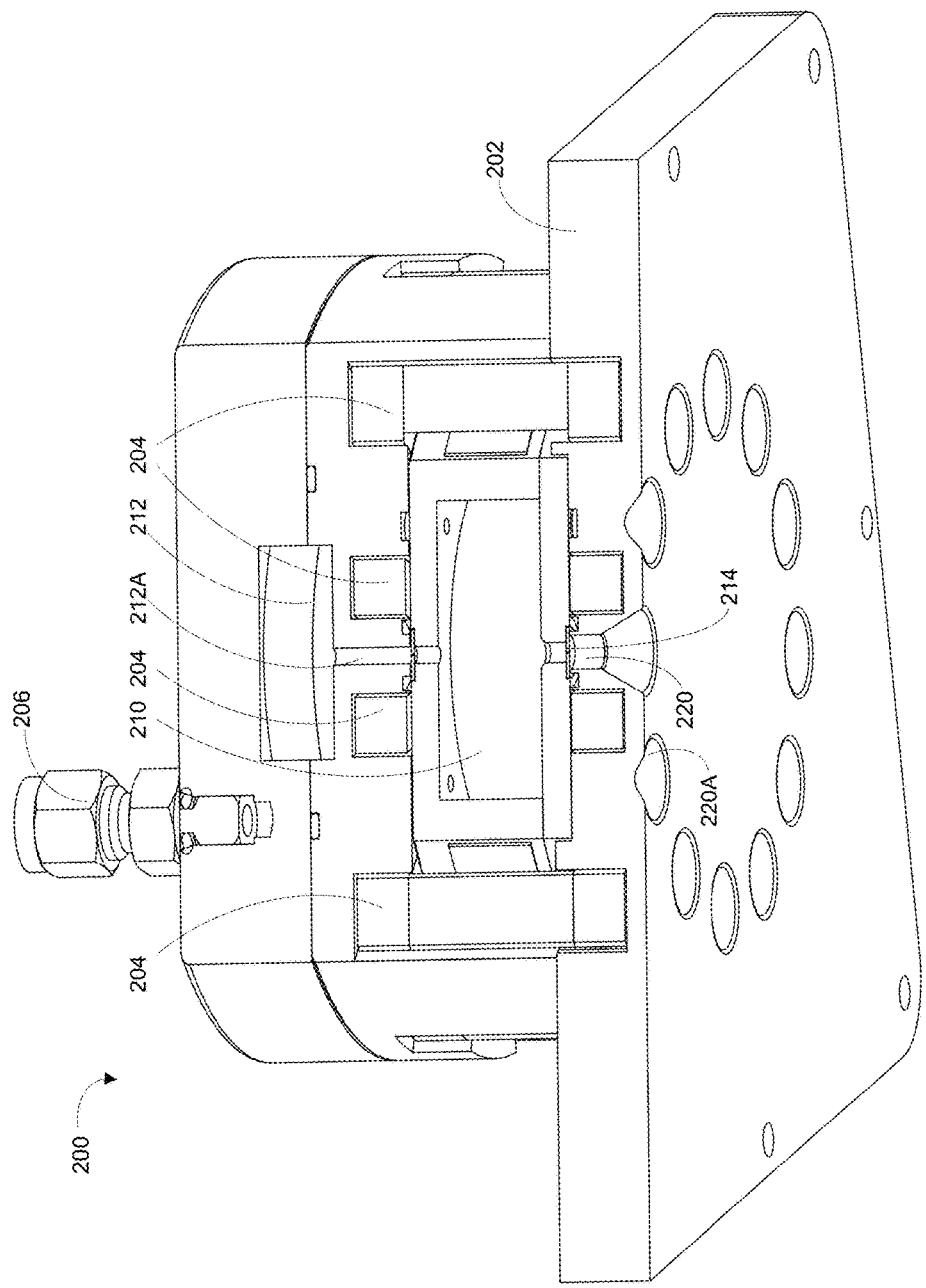
FIG. 2D is a perspective sectional view of a plasma source, in accordance with an embodiment of the present invention.
Figure 2E:
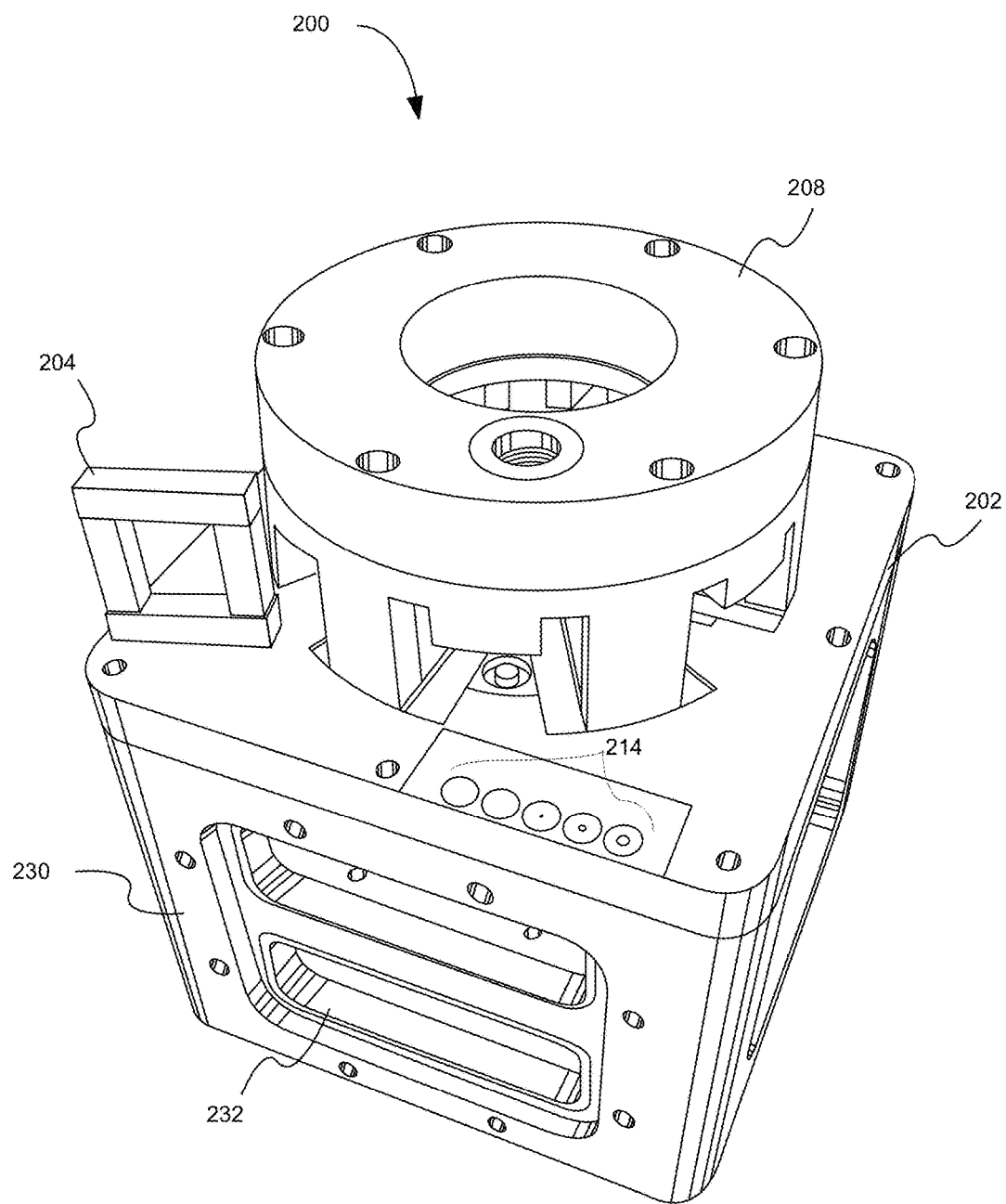
FIG. 2E is a perspective view of a plasma source mounted on a process chamber, in accordance with an embodiment of the present invention.

FIG. 2B is a top view of a plasma source 200, in accordance with an embodiment of the present invention. FIG. 2C is a sectional view 2C-2C of a plasma source 200, in accordance with an embodiment of the present invention. FIG. 2D is a perspective sectional view of a plasma source 200, in accordance with an embodiment of the present invention. FIG. 2E is a perspective view of a plasma source 200 mounted on a process chamber 230, in accordance with an embodiment of the present invention. A process gas plenum 212 is shown as a distributing plenum for the process gas supplied from the process gas inlet 206.

Process gas 110 flows into the inlet port 206 to the process gas plenum 212. The process gas plenum 212 distributes the process gas 110 to inlet ports 212A. The inlet ports 212A direct the process gas 110 into the plasma chamber 210. The process gas inlet ports 212A can be aligned with or offset from the plasma chamber outlets 220. The process gas inlet ports 212A and/or the plasma chamber outlets 220 can be located between the ferrites 204 or aligned with the ferrites or combinations thereof.

The ferrites 204 wrap around the plasma chamber 210 at selected intervals. The ferrites 204 concentrate the magnetic field sufficient to cause the electric field proximate to the center of each ferrite to be strong enough to support a plasma at a corresponding point in the plasma chamber 210.

The ferrites 204 are shown as being substantially square however, as will be shown below, the ferrites can be other shapes. The ferrites 204 are shown as being made in multiple parts 224A, 224B, 224C, 224D, however the ferrites can be in one or more parts. The multiple ferrite parts 224A, 224B, 224C, 224D are substantially close together as required to concentrate the electric field proximate to the center of each ferrite 204. The ferrites 204 are shown distributed about the chamber top 202. The process chamber 230 has sidewalls 230' and base 230". The substrate support 106 is on or near or proximate to the base 230".

Plasma chamber outlets 220 are shown coupling the plasma chamber 210 to the process chamber 230 below the chamber top 202. The plasma chamber outlets 220 deliver plasma and/or radical and/or neutral species from the plasma chamber 210 and into the process chamber 230.

An optional plasma restriction 214 is also shown. The optional plasma restriction 214 can be used to provide a desired pressure differential between the plasma chamber 210 and the process chamber 230. The optional plasma restriction 214 can also be small enough and/or be biased such that plasma is substantially prevented from passing from the plasma chamber 210 to the process chamber 230. In addition, the plasma restriction can be biased to extract ions from the plasma chamber 210 and draw the ions into the process chamber and then onto the wafer. By way of example the optional plasma restriction 214 can have a diameter that is less than or equal to twice a plasma sheath thickness and thus the plasma sheath can prevent the plasma from passing through the optional plasma restriction. The optional plasma restriction 214 can have a selected diameter between about 0.1 mm and about 2.0 mm (e.g., 0.1 mm, 0.2 mm, 0.5 mm, 1.0 mm, 2.0 mm). It should be noted that the aspect ratio of the optional plasma restriction 214 can be used to adjust the effectiveness of plasma restriction. By way of example, a higher aspect ratio (i.e., length/width) plasma restriction 214 can substantially restrict the plasma while having minimal impact on neutral or radical species transport. It should also be understood that larger diameter outlet orifices are can also be used. By way of example the optional plasma restriction 214 can be omitted and the effective restriction is the width of the plasma chamber outlets 220. The width of the plasma chamber outlets 220 can be substantially wide enough to allow a substantially equal pressure in both the plasma chamber 210 and the process chamber 230.

FIG. 2I shows multiple sectional views of the plasma chamber outlets 220, in accordance with embodiments of the present invention. FIG. 2J is a process chamber view of multiple plasma chamber outlets 220, in accordance with embodiments of the present invention. The plasma chamber outlets 220 can be a straight through, substantially cylindrical with a substantially rectangular, cross-sectional shape of the desired width. The plasma chamber outlets 220 can include an optional conical shape 220A. The optional conical shape 220A can provide flow smoothing and/or flow distribution from the plasma chamber outlets 220. The plasma chamber outlets 220 can also include other optional shapes. By way of example the plasma chamber outlets 220 can include a larger width of the same shape 220B or a smaller width of the same shape 220F. The plasma chamber outlets 220 can include an optional curved or bowl shaped outlet 220C, 220E. The optional curved or bowl shaped outlet 220C, 220E can have an opening at the widest point such as outlet 220C or at a narrower point less than the widest point such as outlet 220E. The optional conical shape can be a truncated conical shape 220D.

The optional plasma restriction can be located substantially central along the length of the outlet port 220 such as the optional plasma restriction 214. Alternatively, the optional plasma restriction can be located substantially at the plasma chamber 210 end of the outlet port 220 such as the optional plasma restriction 214'. Alternatively, the optional plasma restriction can be located substantially at the process chamber 230 end of the outlet port 220 such as the optional plasma restriction 214". It should be understood that the optional plasma restriction 214 can be located anywhere along the length of the outlet port 220 between the plasma chamber 210 end and the process chamber 230 end of the outlet port 220.

As shown in FIG. 2J, the plasma chamber outlet 220 can be any suitable shape. By way of example, substantially round 220, substantially elliptical 220H, substantially rectangular 220I, 220J, or other geometrical shapes (e.g., triangular 220K, polygon of any number of sides 220L). The plasma chamber outlet 220 can include substantially sharp edges 220I, 220K, 220L or substantially curved edges and/or sides 220J, 220M, 220N. Combination of shapes can also be included in the plasma chamber outlet 220. By way of example optional conical shape 220A can have a more elliptical shape 220A' rather than a substantially round shape 220A.

The chamber top 202 can also include one or more outlets 234. The outlets 234 are coupled to a lower pressure source (e.g., a vacuum pump). The outlets 234 allow the lower pressure source to withdraw the plasma byproducts 118 and recombination products 120 from near the center of the process chamber 230. As a result, the plasma byproducts 118 and recombination products 120 do not interfere with the plasma 410 and the neutral species 412 generated by the plasma in the process chamber.

The process chamber 230 includes load ports 232 and support structure for supporting the substrate to be processed. Other features may also be included in the process chamber 230 as are well known in the art.

Figure 2F:
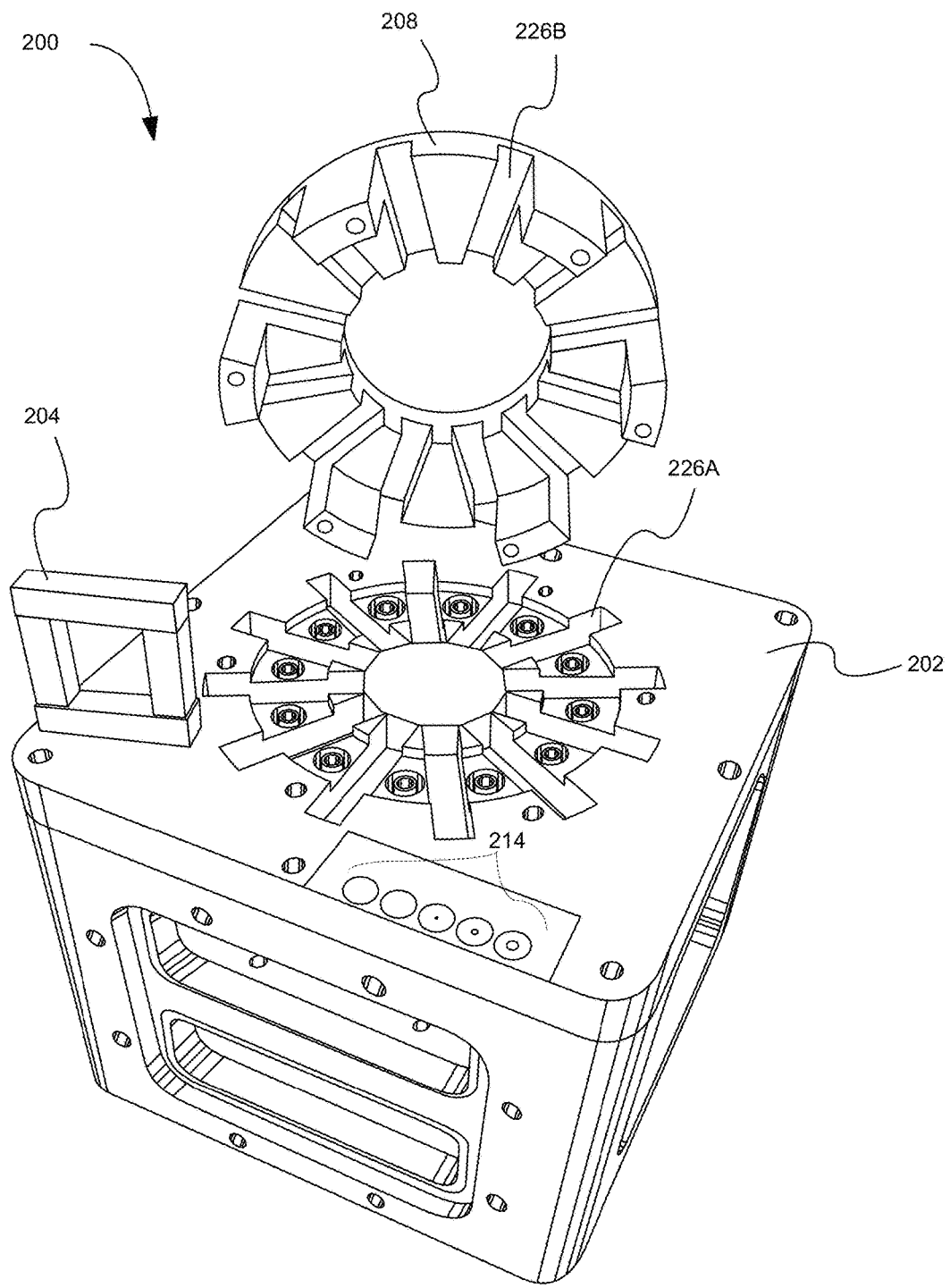
FIGS. 2F and 2G are additional perspective views of a plasma source 200 mounted on a process chamber, in accordance with an embodiment of the present invention.
Figure 2G:
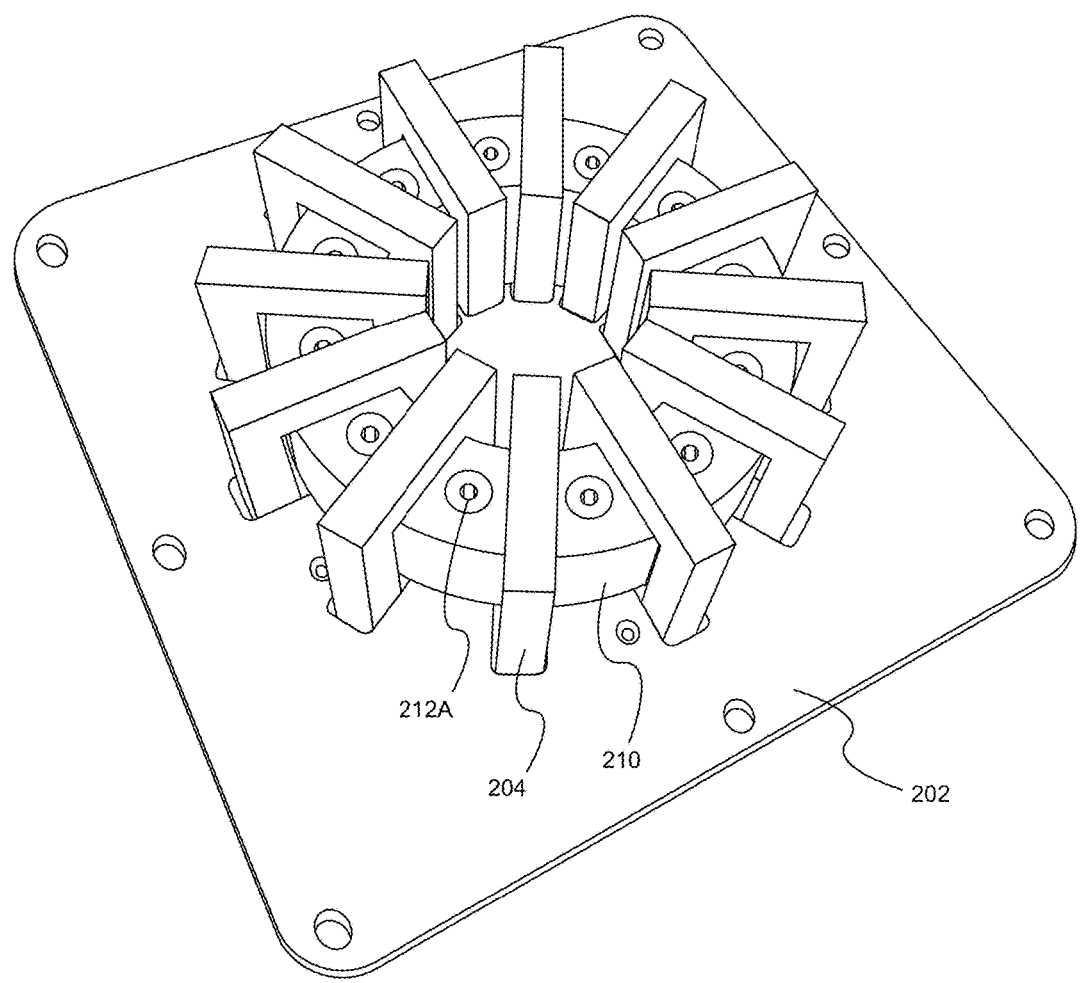

FIGS. 2F and 2G are additional perspective views of a plasma source 200 mounted on a process chamber 230, in accordance with an embodiment of the present invention. The plasma source top 208 is shown lifted (FIG. 2F) and removed (FIG. 2G) for description of additional details. The plasma chamber 210 can be constructed of a different material than the plasma source top 208 or the process chamber 230. By way of example, the plasma chamber 210 can be a ceramic and the plasma source top 208 or the process chamber 230 could be ceramic, metal (e.g., aluminum, steel, stainless steel, etc.). Slots 226A and 226B are provided for the support and installation of the ferrites 204.

As shown in FIG. 2G the ferrites 204 are shown wrapping around the exterior of plasma chamber 210. The plasma chamber 210 can be formed of a dielectric such as a ceramic or other dielectric material (e.g., quartz, silica (siO2), alumina (Al2O3), sapphire (Al2O3), aluminum nitride (AlN), yttrium oxide (Y2O3) and/or similar materials and combinations thereof).

Figure 2H:
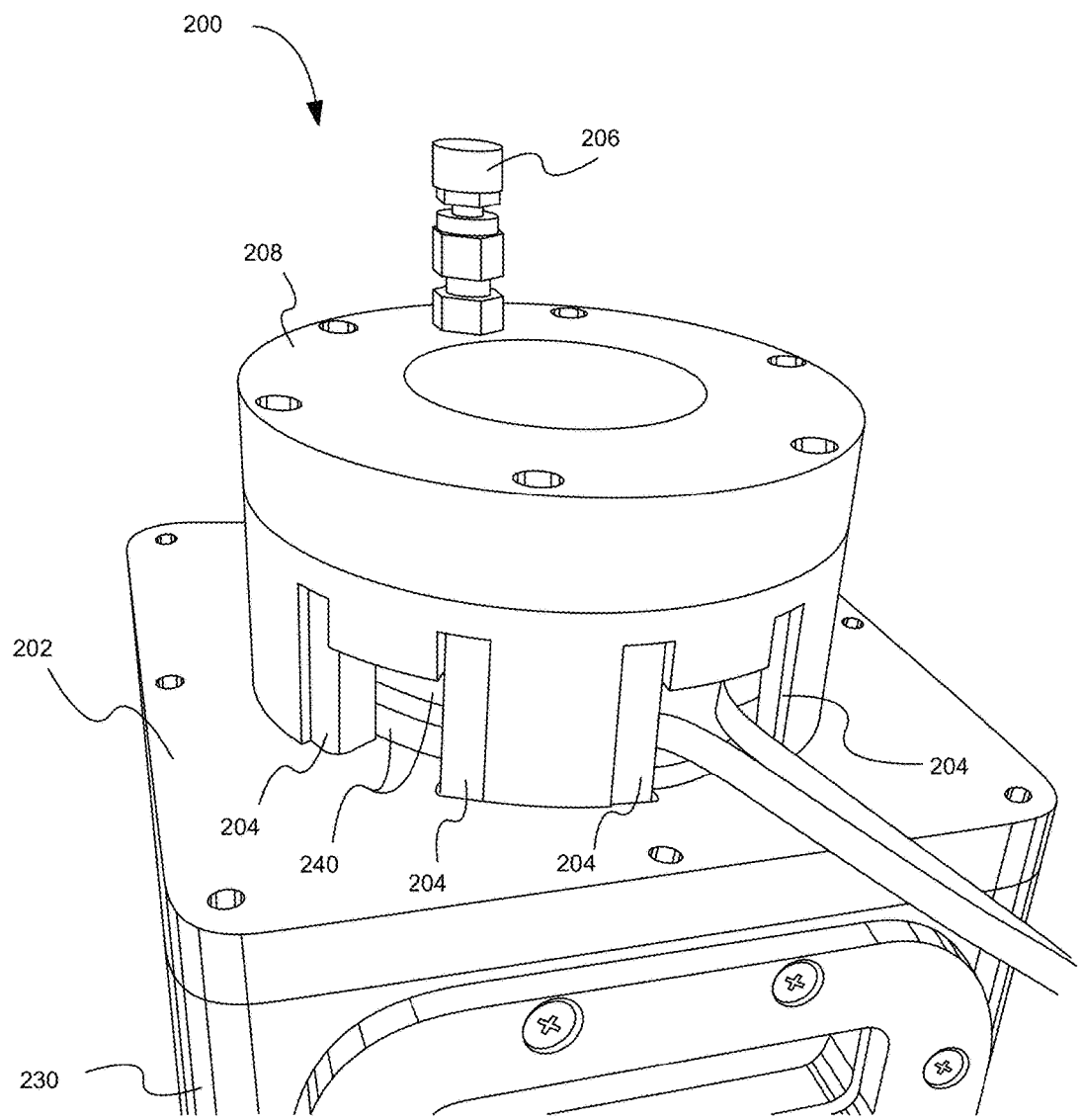
FIG. 2H is another perspective view of a plasma source mounted on a process chamber 230, in accordance with an embodiment of the present invention.

FIG. 2H is another perspective view of a plasma source 200 mounted on a process chamber 230, in accordance with an embodiment of the present invention. As shown in FIG. 2H, a primary conductor 240 is shown wrapped around the plasma chamber 210. The primary conductor 240 is the primary winding of an inductive element as will be described in more detail in FIG. 7 below. The primary conductor 240 has one or more turns around the plasma chamber 210. As shown here, the primary conductor 240 has two turns around the plasma chamber 210, however more than two turns could also be used.

FIG. 3A is a perspective view of another plasma source 300, in accordance with an embodiment of the present invention. The plasma source 300 includes plasma chamber 210 having multiple ferrite elements 204 surrounding the plasma chamber at selected intervals. In this instance the ferrite elements 204 surrounding the plasma chamber at substantially equal intervals but they could be at different intervals.

The plasma chamber 210 can be roughly circular or geometrically shaped, such as in this instance, having five sides. Similarly, the plasma chamber 210 could be circular or three or more sided geometrical shapes. It should also be noted that the plasma chamber 210 could have an approximately rectangular or approximately circular or rounded cross-sectional shape. The inner surfaces of the plasma chamber 210 can be smoothed and without any sharp (e.g., about perpendicular or more acute angle) edges or corners. By way of example, the inner corners can have a rounded contour with a relatively large radius (e.g. between about ½ and about twice the radius of a cross-section of the plasma chamber). It should also be noted that while a single process gas inlet 206 is shown coupled to the plasma chamber 210, two or more process gas inlet's could be used to supply process gas to the plasma chamber.

FIG. 3B is a top perspective view of a multizone plasma source 320, in accordance with an embodiment of the present invention. The multizone plasma source 320 includes multiple, individual, concentric plasma chambers 310A-310D, e.g., in nested rings. Each of the concentric plasma chambers 310A-310D has a corresponding set of ferrites 204A-204D.

Figure 3C:
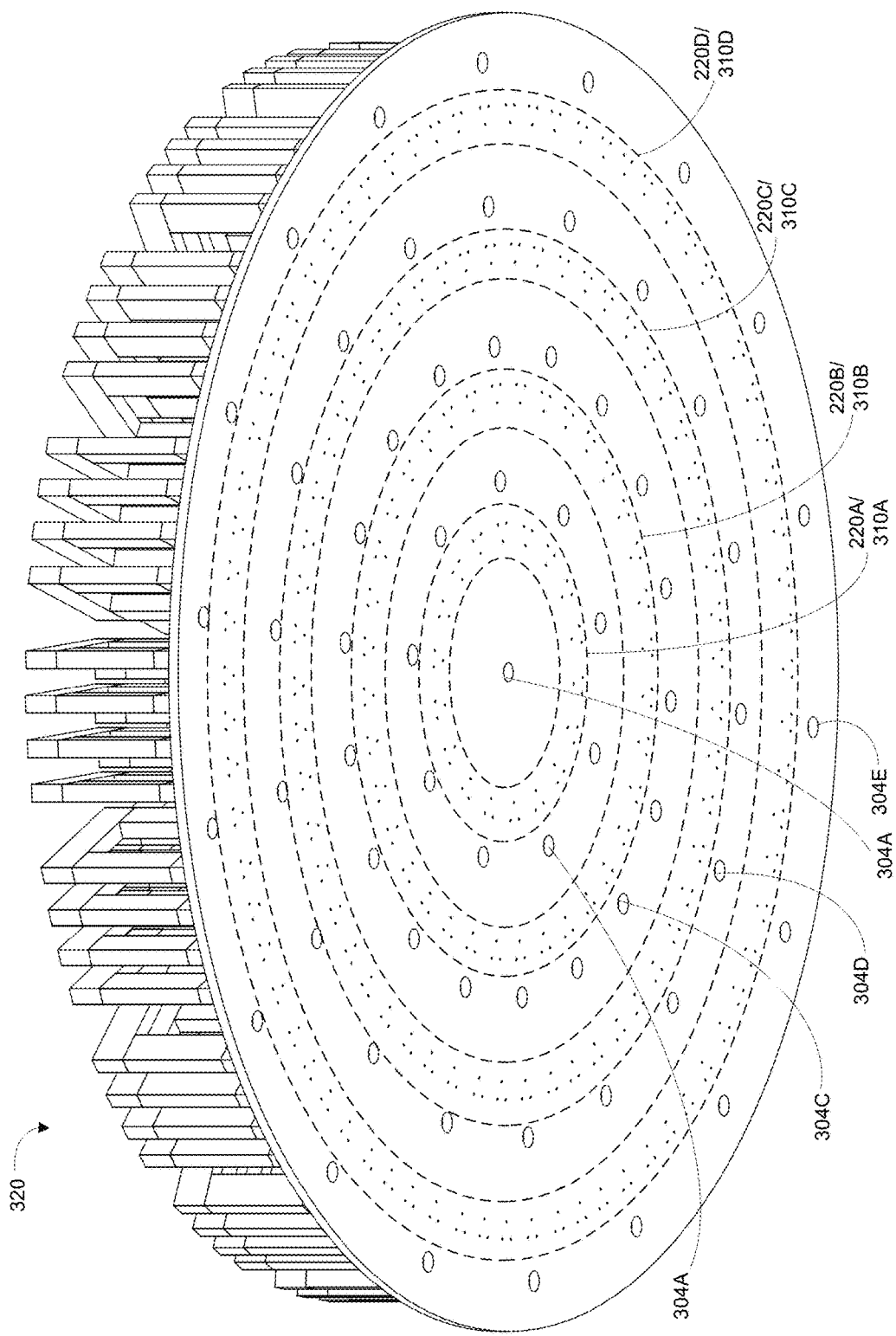
FIG. 3C is a bottom perspective view of multizone plasma source, in accordance with an embodiment of the present invention.

FIG. 3C is a bottom perspective view of multizone plasma source 320, in accordance with an embodiment of the present invention. The chamber top 202 has multiple process outlet ports 304A-304E and multiple plasma outlet ports 220A-220D. The multiple plasma outlet ports 220A-220D are coupled to corresponding plasma chambers 310A-310D.

Figure 3D:
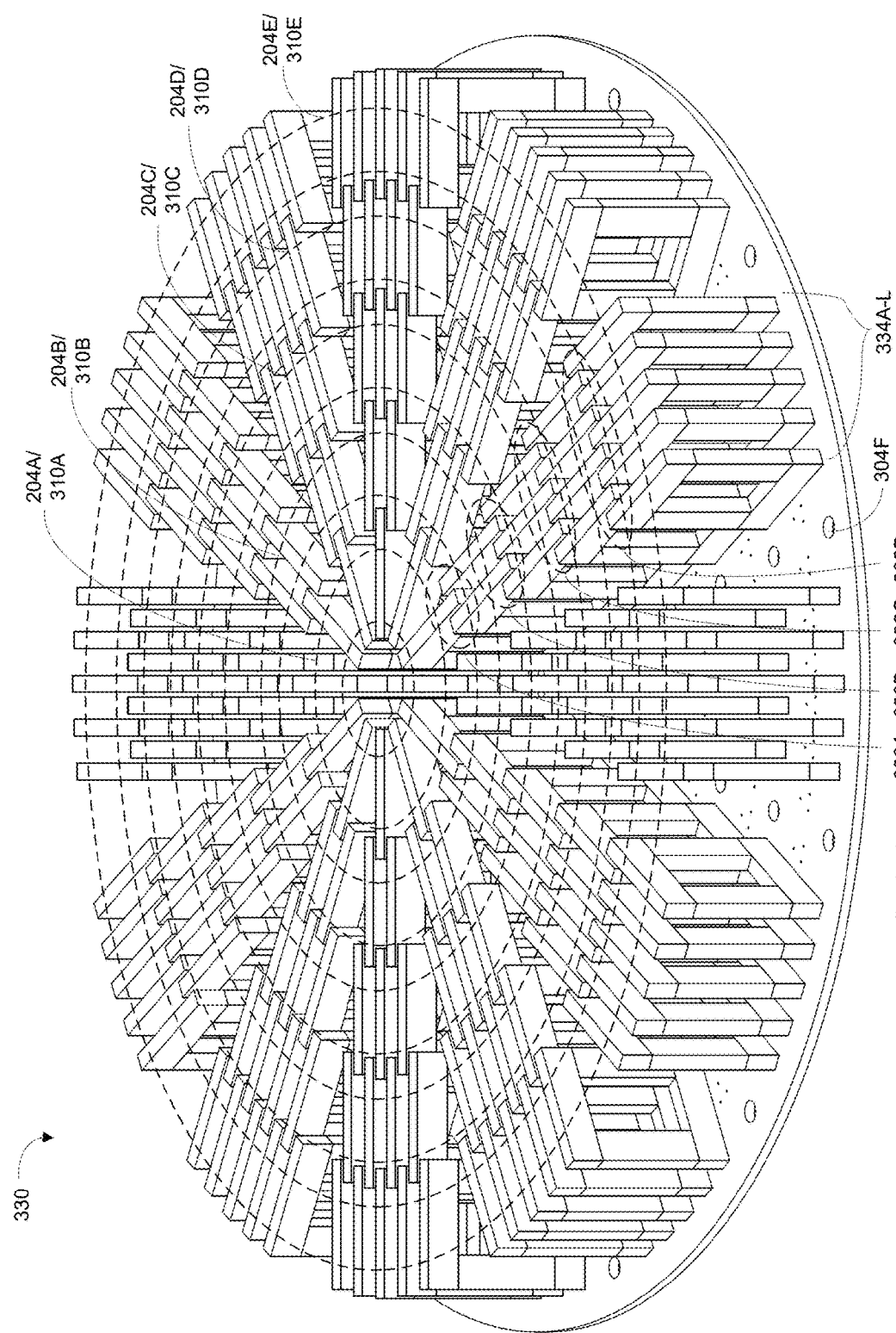
FIG. 3D is a top perspective view of another multizone plasma source, in accordance with an embodiment of the present invention.

FIG. 3D is a top perspective view of another multizone plasma source 330, in accordance with an embodiment of the present invention. FIG. 3E is a bottom perspective view of multizone plasma source 330, in accordance with an embodiment of the present invention. The multizone plasma source 330 includes multiple concentric plasma chambers 310A-310E. Each of the concentric plasma chambers 310A-310E has a corresponding set of ferrites 204A-204E.

As shown the ferrites 204A-204E of adjacent plasma chambers 310A-310E can overlap slightly as shown in regions 332A-332D. By way of example, inner edges of ferrites 204B overlap the outer edges of ferrites 204A in region 332A. Similarly, outer edges of ferrites 204B overlap the inner edges of ferrites 204C in region 332B. The overlapping ferrites 204A-204E allow the concentric plasma chambers 310A-310E to be more closely packed in the multizone plasma source 330. Thus allowing more concentric rings 310A-310E (e.g., five concentric rings) to be included in the same diameter as non-overlapping ferrite embodiment shown in FIGS. 3B and 3C having only four concentric rings 310A-310D. As will be described below, each ring 310A-310E can be individually controlled in bias, gas flow, concentration, RF power, etc. Thus, a greater number of concentric rings 310A-310E provides a more fine tuning control of the process across the diameter of the substrate 102 in the process chamber 230.

The ferrites 204A-204E can optionally be arranged in multiple radial segments (i.e., pie slice shapes) 334A-334L of the multizone plasma source 330. As will be described below, each radial segment 334A-334L can be individually controlled in bias, gas flow, concentration, etc. Thus, the radial segments 334A-334L provide yet another fine tuning control of the process radially across the substrate 102 in the process chamber 230.

Figure 4A:
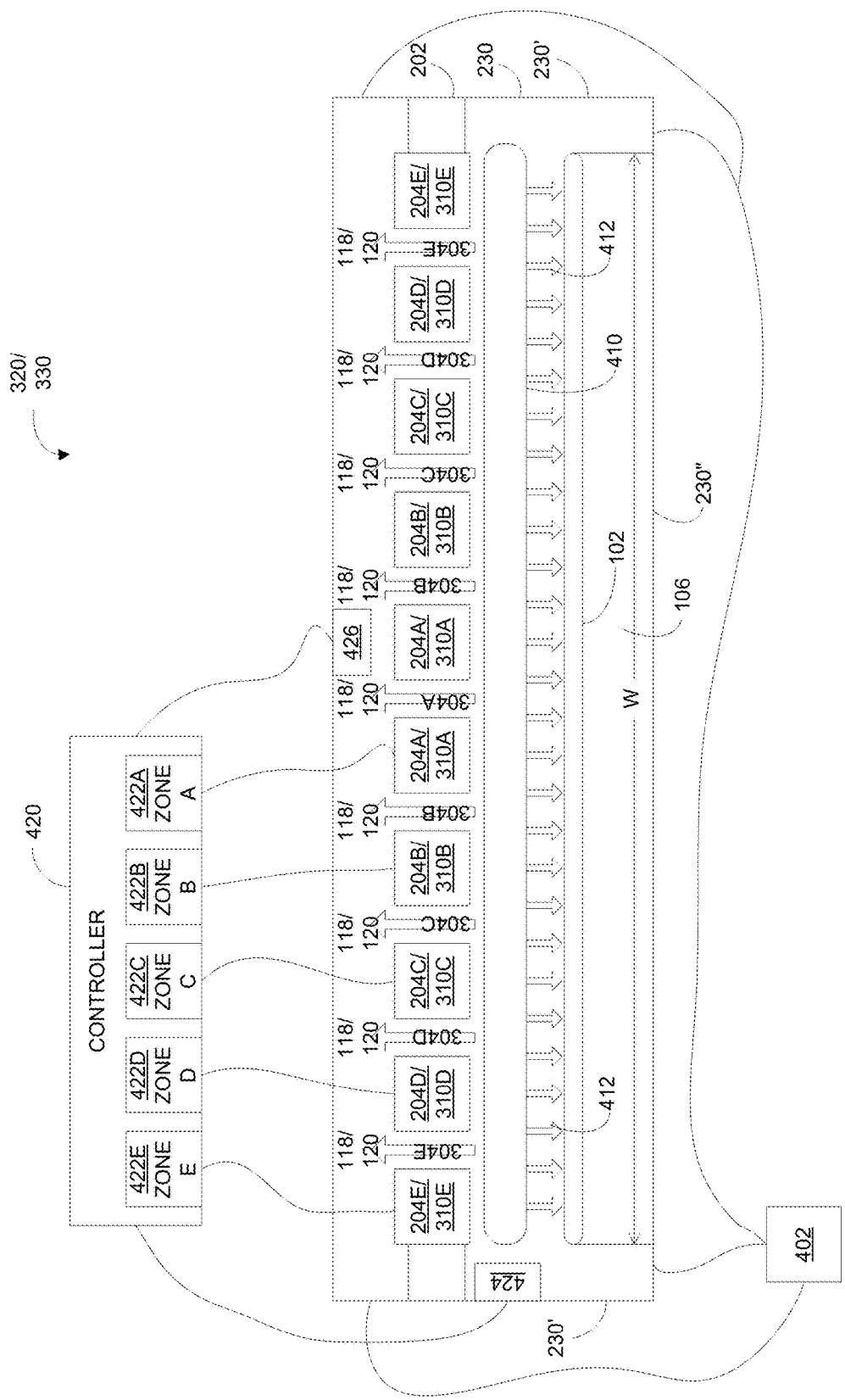
FIGS. 4A and 4B are simplified schematic views of multizone plasma sources, in accordance with an embodiment of the present invention.
Figure 4B:
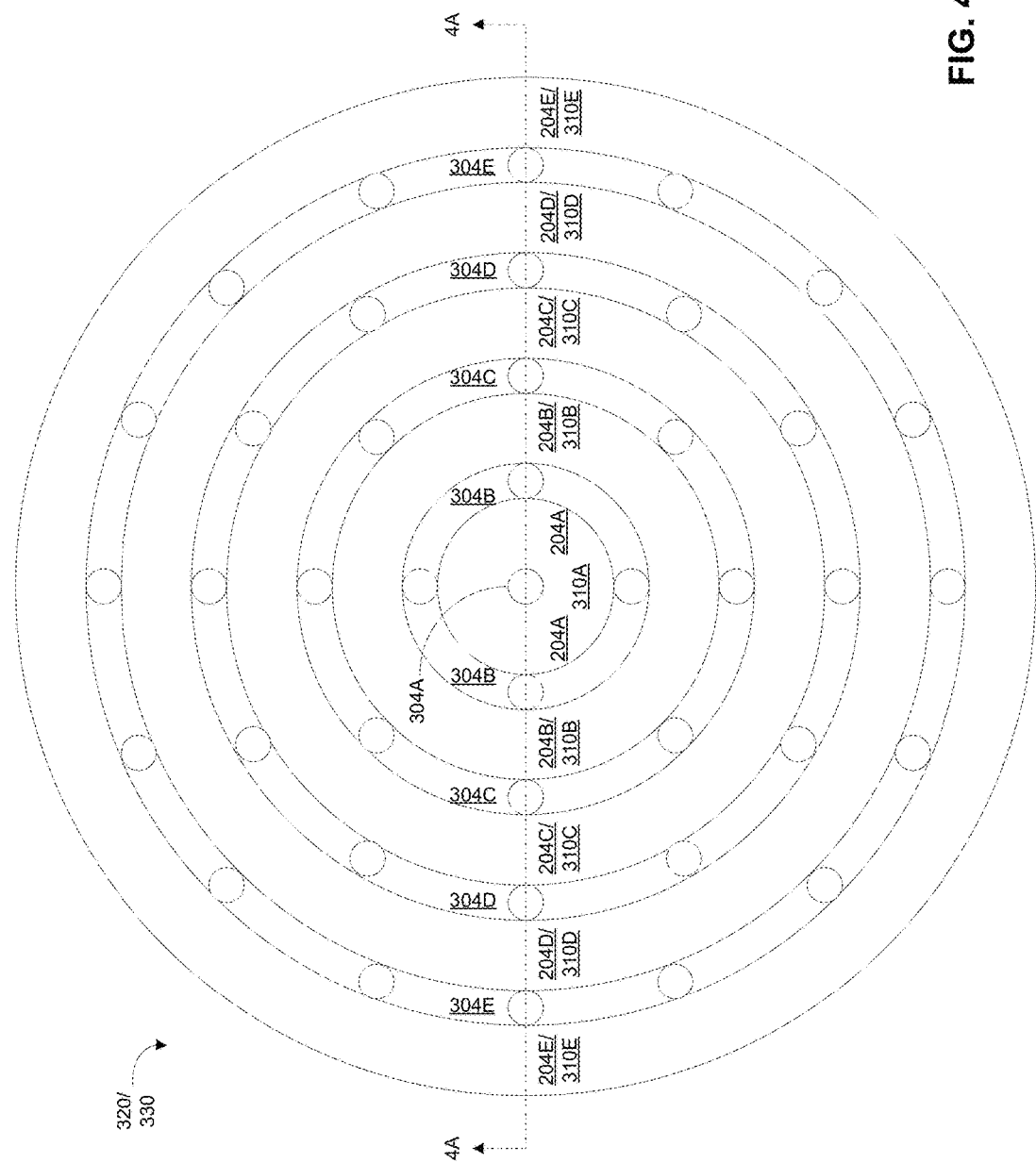

FIGS. 4A and 4B are simplified schematic views of multizone plasma sources 300, 320, in accordance with an embodiment of the present invention. The chamber top 202 includes the multizone plasma sources 300, 320. The process chamber 230 has sidewalls 230' and base 230". The substrate support 106 is on or near or proximate to the base 230". The process outlet ports 304A-304E withdraw the plasma byproducts 118 and recombination products 120 substantially equally across the width W of the substrate 102. As a result, the plasma byproducts 118 and recombination products 120 do not interfere with the plasma 410 and the neutral species 412 generated by the plasma. The neutral species 412 are therefore substantially evenly distributed across the width of the substrate 102. The neutral species 412 react with the surface of the substrate 102. As the neutral species 412 are substantially evenly distributed across the width of the substrate 102, the center-to-edge non-uniformities of the plasma processes (e.g., etch, strip or other plasma processes) applied in the processing chamber 230 are also substantially eliminated.

A controller 420 includes corresponding controls 422A-422E (e.g., software, logic, set points, recipes, etc.) for each ring 310A-310E. Process monitoring sensors 424, 426 can also be coupled to the controller 420 to provide a process feedback. The controls 422A-422E can individually control each ring 310A-310E such as a bias signal (from bias supply), power, frequency, process gas 110 pressures, flow rates and concentrations. Thus providing a radial profile control of dissociated gas across the diameter of the substrate 102 in the process chamber 230.

Each of the multiple plasma chambers 310A-310E can be controlled independently to manipulate the processes in the corresponding region of the processing chamber 230.

Similarly, each of the multiple radial segments 334A-334L allows each radial segment of the multiple plasma chambers 310A-310E to be controlled independently to manipulate the processes in the corresponding region of the processing chamber 230. By way of example, a process variable set point for the flow rate and pressure of the process gas 110 in the plasma chamber 310B is input to the corresponding control 422B. At least one of the process monitoring sensors 424, 426 provides a process measurement input to the corresponding control 422B. Based on the process measurement input from the process monitoring sensors 424, 426 and the logic and software, the corresponding control 422B then outputs revised setpoints for the RF power to ferrites 310B and the flow rate and the pressure of the process gas 110 in the plasma chamber 310B.

Similarly, the processes can be monitored and/or controlled in each of the respective regions defined by one or more or a combination of the concentric ring plasma chambers 310A-E, and/or the ferrites 204A-E, and/or the radial segments 334A-334L of the multizone plasma sources 200, 300, 310, 320, 330. It should also be understood that each of the zones could be operated in the same manner and setpoints so that the multizone plasma sources 200, 300, 310, 320, 330 are effectively a single zone plasma source. Further, some of the zones of the multizone plasma sources 200, 300, 310, 320, 330 can be operated in the same manner and setpoints so that the multizone plasma sources have less zones.

Figure 5:
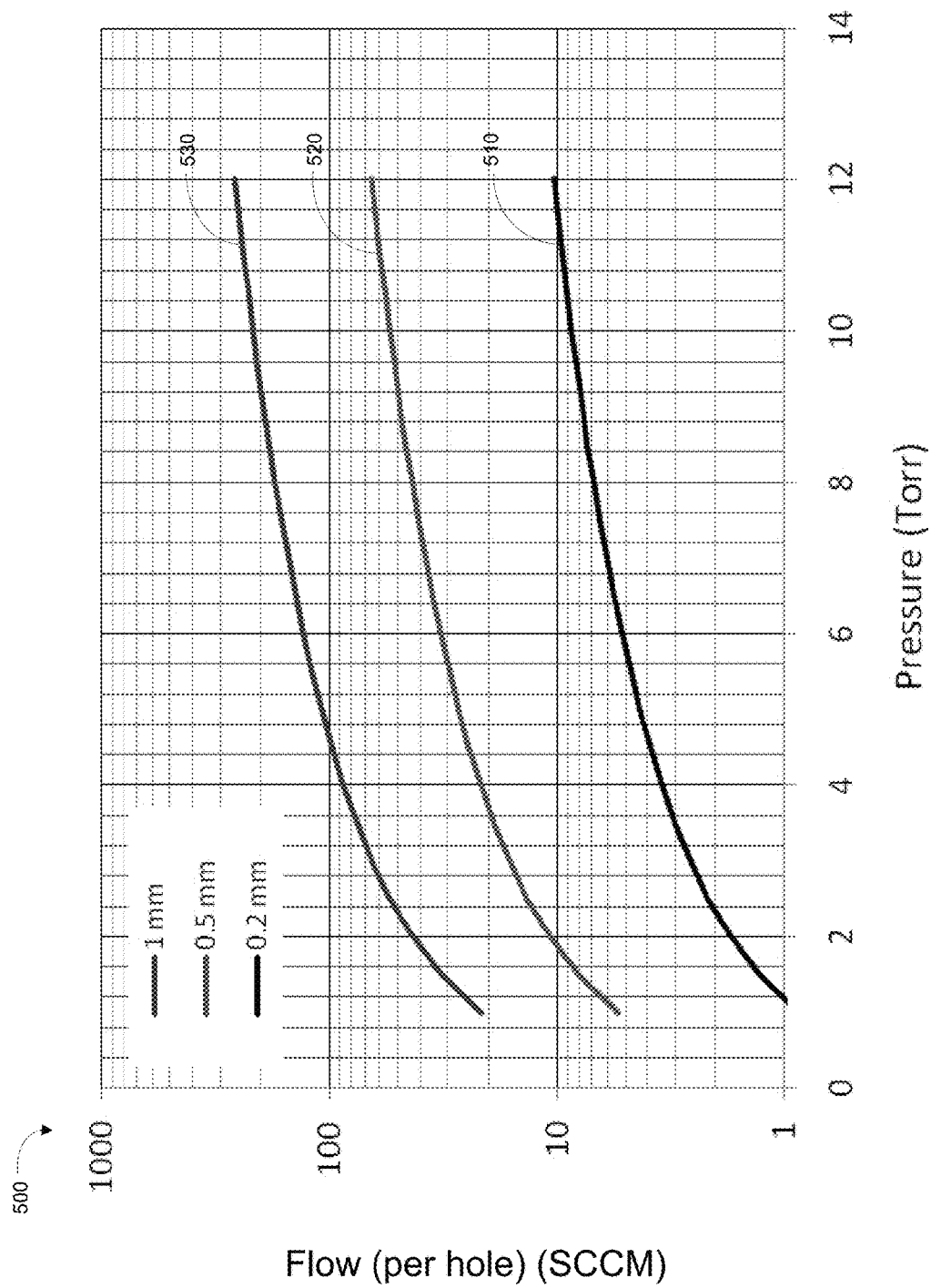
FIG. 5 is a flow and pressure graph for various sizes of the optional plasma restriction, in accordance with an embodiment of the present invention.

FIG. 5 is a flow and pressure graph for various sizes of the optional plasma restriction 214, in accordance with an embodiment of the present invention. Graph 510 is the flow rate in standard cubic centimeters per minute (SCCM) for an optional plasma restriction 214 having a diameter of 0.2 mm. Graph 520 is the flow rate for an optional plasma restriction 214 having a diameter of 0.5 mm. Graph 530 is the flow rate for an optional plasma restriction 214 having a diameter of 1.0 mm. As can be seen, the various sizes of the optional plasma restriction 214 can determine a pressure drop between the plasma chamber 210 and the process chamber 230. If the pressure drop is such that choked flow occurs across the plasma restriction 214, the mass flow rate into the process chamber 210 will not increase with a decrease in the plasma chamber when pressure in the plasma chamber 210 is constant.

Increasing the pressure in the plasma chamber 210 provides the density of the process gas 110 sufficient to support a plasma in the plasma chamber. For a fixed RF voltage, the current required to be induced into the process gas 110 is inversely proportional to the process gas pressure. Therefore, increasing the process gas 110 pressure in the plasma chamber 210 reduces the current required to produce the plasma. Further, since the plasma requires the process gas pressure to support the plasma, then the plasma will be contained in the plasma chamber 210 and will not flow from the plasma chamber into the process chamber 230. As a result, the plasma restriction 214 can restrict the plasma to the plasma chamber 210.

A transformer has a primary winding and a secondary winding. A primary current through the primary winding generates a magnetic field. As the magnetic field passes through the secondary winding, a corresponding secondary current is induced into the secondary winding. A transformer with a ferrite core, concentrates (i.e., focuses) the magnetic field to a smaller, denser magnetic field and therefore more efficiently induces the secondary current into the secondary winding. This allows for very efficient low frequency operation (e.g., less than about 13 MHz and more specifically between 10 kHz and less than about 5 MHz and more specifically between about 10 kHz and less than about 1 MHz). The low frequency operation also provides significantly lower cost relative to typical high frequency RF plasma systems (e.g., about 13.56 MHz and higher frequencies).

A further advantage of low frequency ferrite coupled plasma systems is their low ion bombardment energies, which results in less plasma erosion and fewer on-wafer particulates relative to a high-frequency RF system. Less plasma erosion results in less wear and tear on the plasma chamber 210 surfaces and components.

Figure 6B:
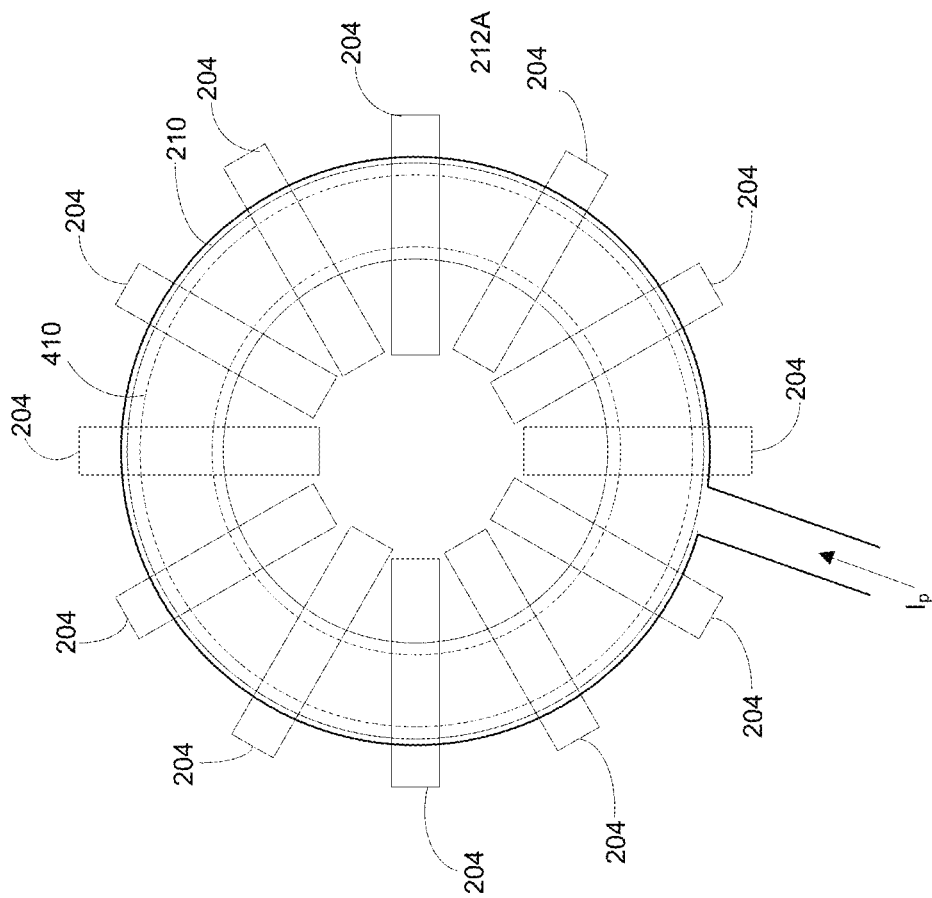
FIG. 6B is a schematic of a single ring of ferrites and plasma chamber in a plasma source, in accordance with an embodiment of the present invention.
Figure 6A:
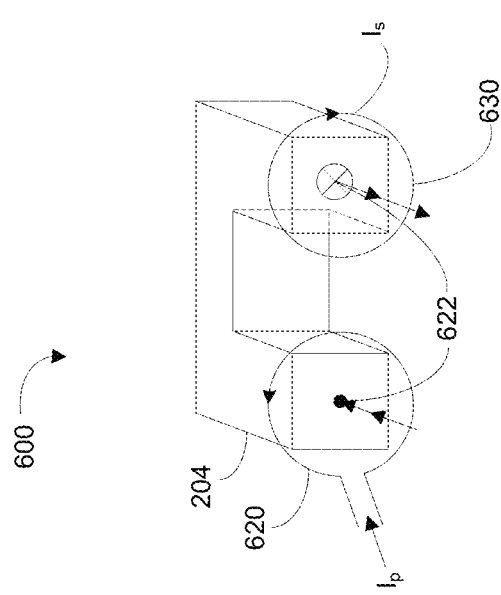
FIG. 6A is a schematic of an exemplary transformer, in accordance with an embodiment of the present invention.

FIG. 6A is a schematic of an exemplary transformer 600, in accordance with an embodiment of the present invention. A primary current $I_p$ is applied to the primary winding 620 from a power supply. The flow of the primary current $I_p$ through the primary winding 620 produces a magnetic field 622 into the ferrite 204. The magnetic field 622 emerges from the ferrite in the center of the secondary winding 630 and induces a secondary current $I_s$ in the secondary winding.

Figure 7:
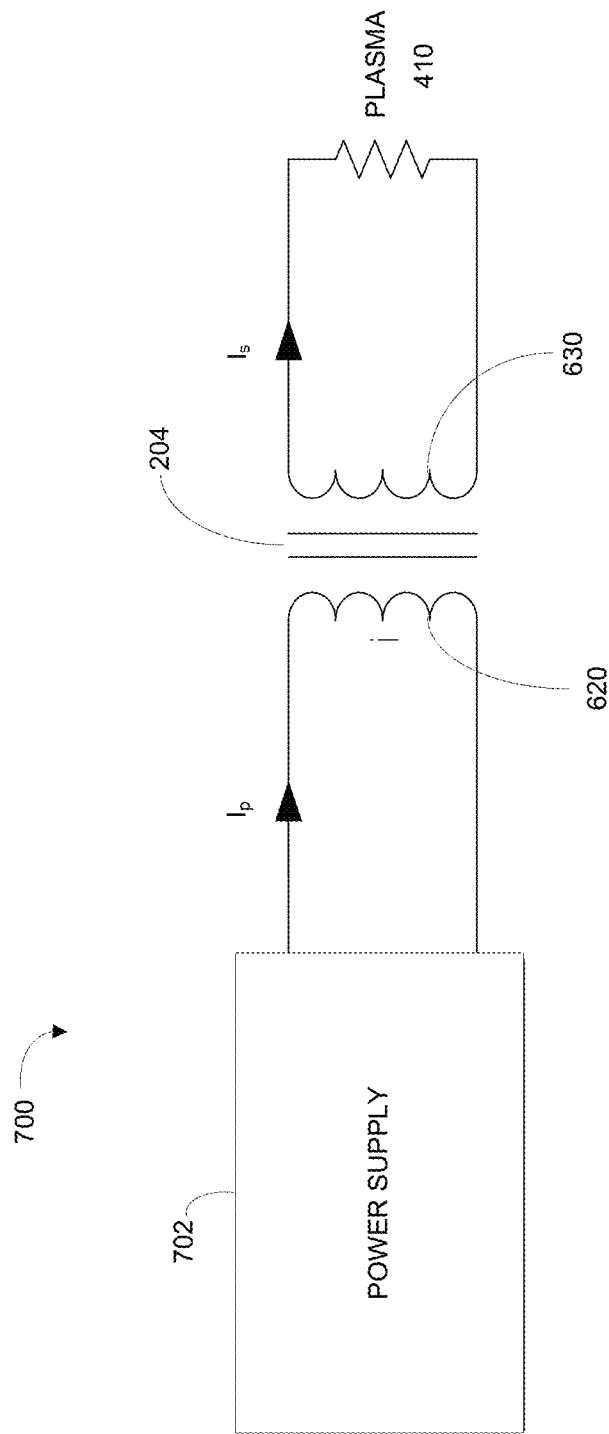
FIG. 7 is an electrical schematic of a single ring of ferrites and plasma chamber in a multizone plasma source, in accordance with an embodiment of the present invention

FIG. 6B is a schematic of a single ring of ferrites 204 and plasma chamber 210 in a plasma source 200, 300, 310, 320, 330, in accordance with an embodiment of the present invention. FIG. 7 is an electrical schematic 700 of a single ring of ferrites 204 and plasma chamber 210 in a plasma source 200, 300, 310, 320, 330, in accordance with an embodiment of the present invention. In the plasma sources 200, 300, 310, 320, 330, described herein, the primary winding 240 is wrapped around each plasma chamber 210 and inside each respective set of ferrites 204, 204A-E. The secondary winding is the process gas 110 inside the plasma chamber 210.

A primary current $I_p$ is applied to the primary winding 240 from a power supply 702. The power can be RF (e.g., about 10 kHz to about 1 MHz or more or between about 10 kHz to about 5 MHz or between about 10 kHz to less than about 13 MHz). The flow of the primary current $I_p$ through the primary winding 240 produces a magnetic field 622 in the ferrites 204. The magnetic field 622 induces a secondary current $I_s$ in the process gas 110 inside the plasma chamber 210. As a result, the process gas is excited sufficiently to form a plasma 410.

Figure 8:
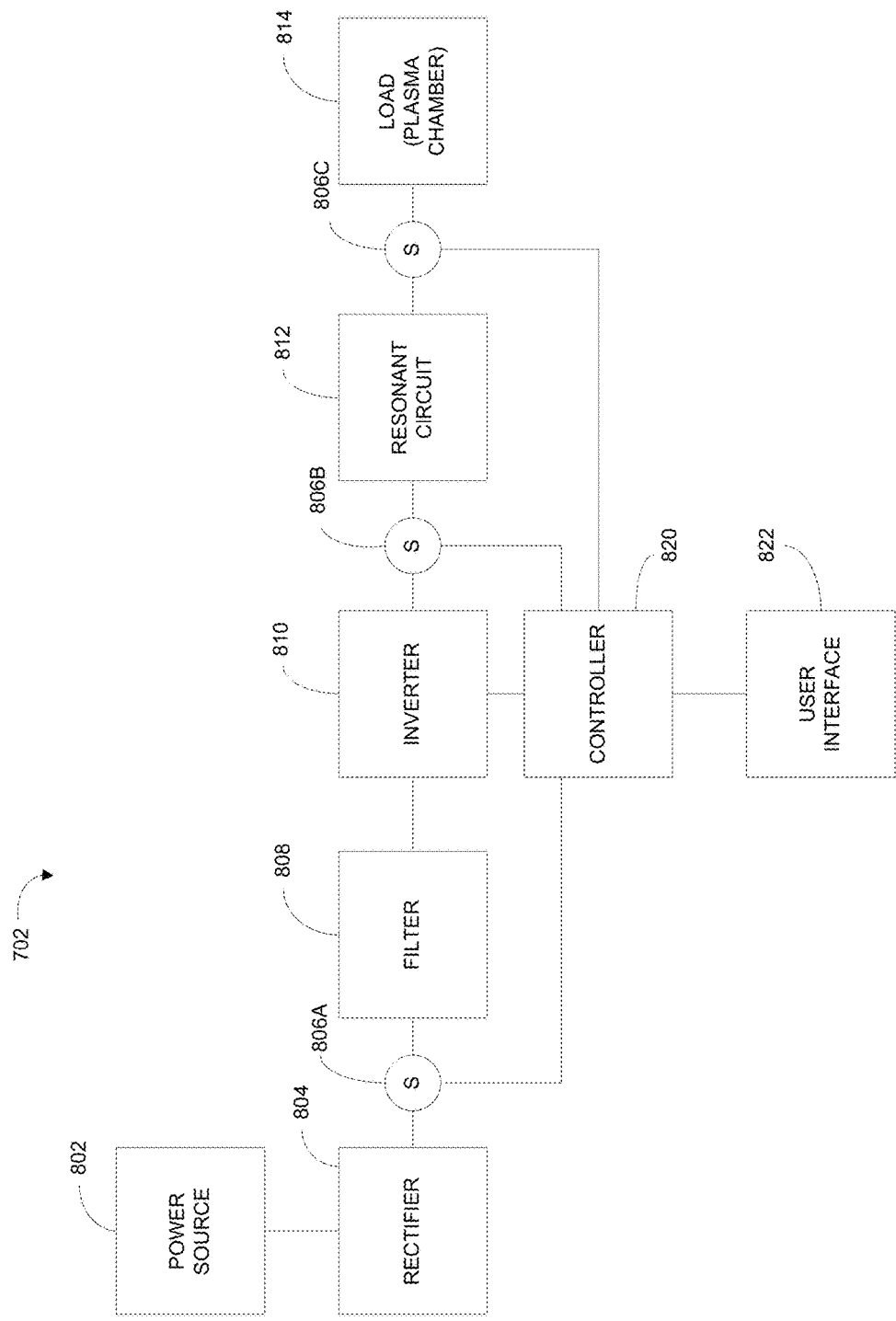
FIG. 8 is an electrical schematic of a power supply, in accordance with an embodiment of the present invention.

FIG. 8 is an electrical schematic of a power supply 702, in accordance with an embodiment of the present invention. The power supply 702 includes a rectifier 804 for converting the AC power from the power source 802 into a DC power. The filter 808 filters the output of the rectifier 804. The filtered DC is delivered to the inverter 810 from the filter 808. The inverter 810 converts the filtered DC to an AC signal at the desired frequency, voltage and current. A resonant circuit 812 matches resonance with the plasma chamber load 814 so as to efficiently deliver the desired AC signal to the load in resonance.

A controller 820 controls the power supply 702. The controller 820 includes a user interface 822 that may include a link (e.g., network) to a system controller or a larger area control system (not shown). The controller 820 is coupled to the Components 804, 808, 810, 812 directly and via sensors 806A, 806B, 806C for monitoring and controlling the operation thereof. By way of example the controller 820 monitors one or more of the voltage, current, power, frequency and phase of the power signals within the power supply 702.

Figure 9A:
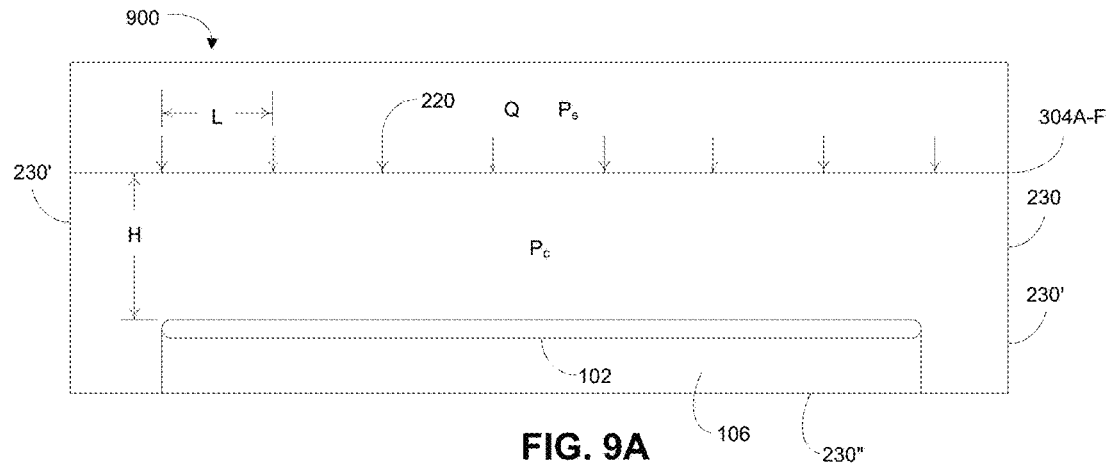
FIGS. 9A-9C are flow diagrams of the flow from the plasma source, in accordance with an embodiment of the present invention.
Figure 9B:
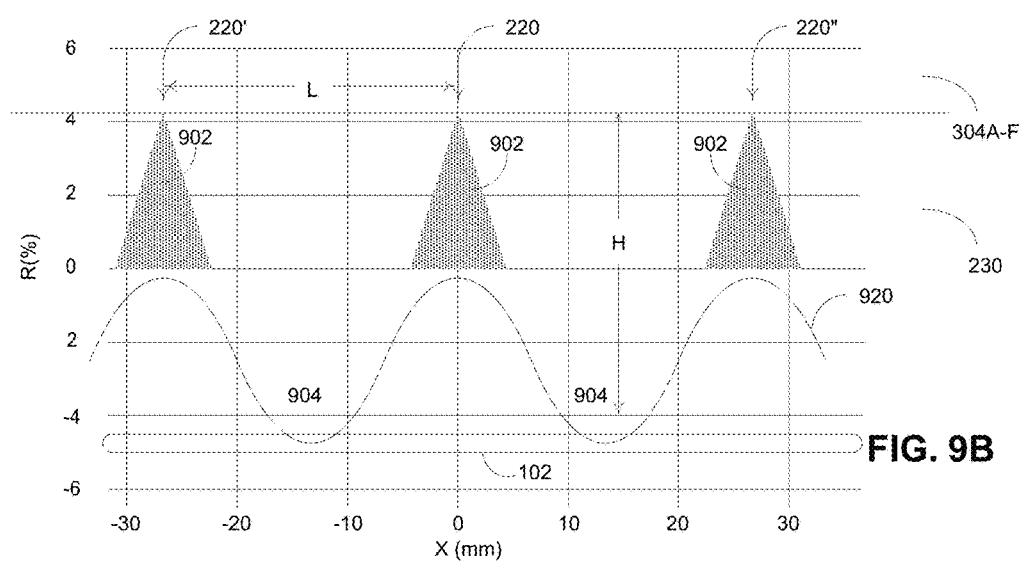
Figure 9C:
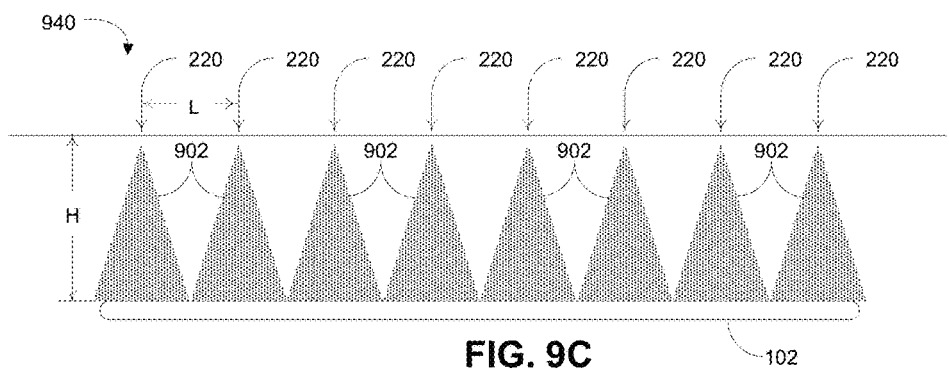

FIGS. 9A-9C are flow diagrams of the flow from the plasma source 300, 310, 320, 330, in accordance with an embodiment of the present invention. The radicals and neutrals flow 902 are shown flowing from the plasma chamber 304A-F toward a substrate 102 in an approximant fan shape. The fan shape begins at the outlet ports 220 and expands as it approaches the wafer 102. The gas flowing through the plasma chamber 304A-F has a flowrate Q and a pressure Ps. The pressure Pc is the pressure in the process chamber 230. The difference between Ps and Pc allows the radicals and neutrals flow 902 to expand toward the wafer 102.

Referring now to FIG. 9B, the concentration 920 of the radicals and neutrals flow 902 is a function of the distance L between the outlet ports 220 and the height H of the process chamber 230. If the distance L between the outlet ports 220 is too great then there will be regions 904 where the concentration 920 of the radicals and neutrals flow 902 is insufficient to react with the surface of the wafer 102. Similarly, if the height H of the process chamber 230 is too small, then there will be regions 904 where the concentration 920 of the radicals and neutrals flow 902 is insufficient to react with the surface of the wafer 102. FIG. 9C shows an ideal relationship of Height H and distance L as follows:

$$R = R(x, H, L)$$

Where: $R(x) = (n_{total} - n_0)/n_0$ and $n_{total}(x) = \sum_i n_i$

If distance L is approximately equal to height H/2 the variation of concentration of the radicals and neutrals across the surface of the wafer can be minimized. Alternatively, increasing or decreasing the relationship of distance L and height H can allow variation in concentration of the radicals and neutrals across the surface of the wafer.

Figure 10:
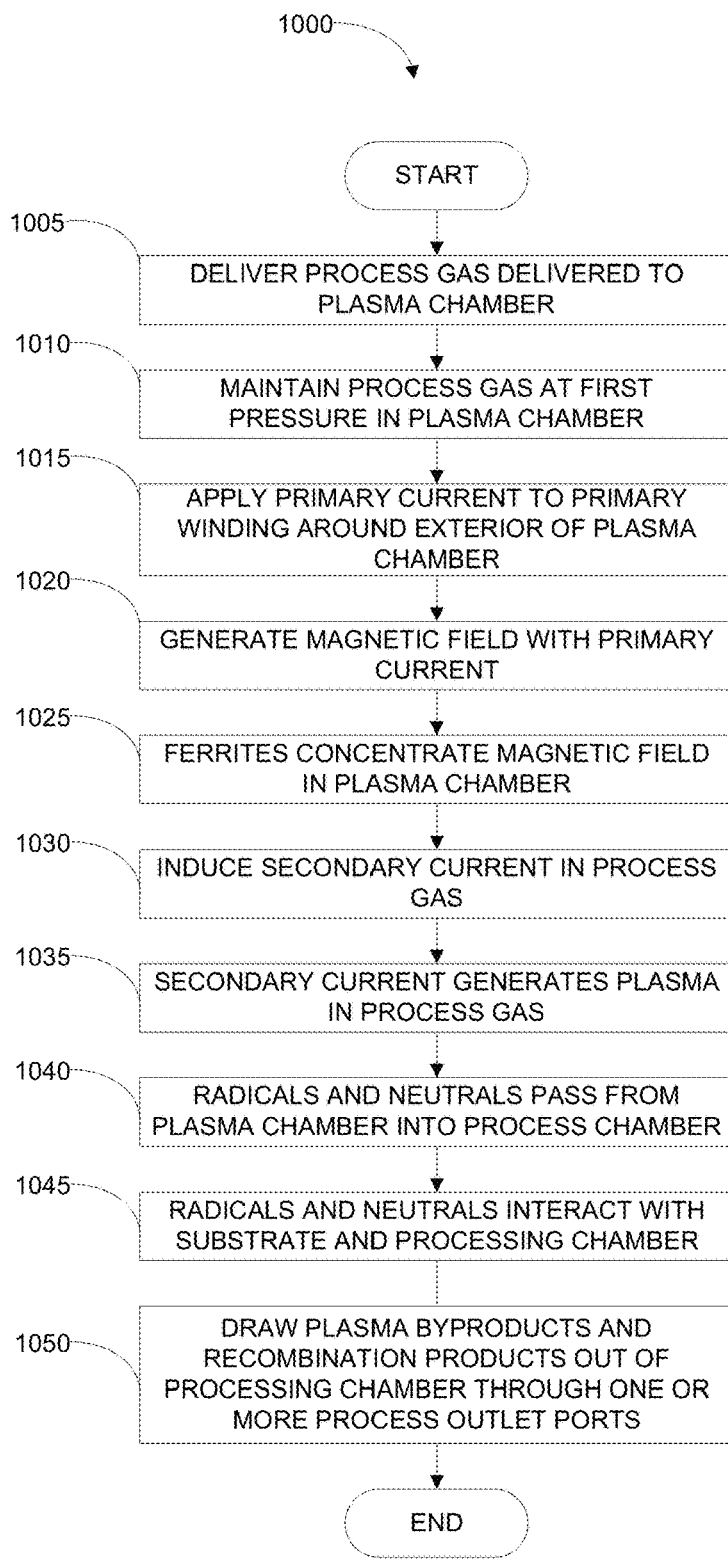
FIG. 10 is a flowchart diagram that illustrates the method operations performed in operation of the plasma sources described herein, in accordance with one embodiment of the present invention.

FIG. 10 is a flowchart diagram that illustrates the method operations performed in operation of the plasma source 200, 300, 310, 320, 330, in accordance with one embodiment of the present invention. The operations illustrated herein are by way of example, as it should be understood that some operations may have sub-operations and in other instances, certain operations described herein may not be included in the illustrated operations. With this in mind, the method and operations 1000 will now be described.

In an operation 1005, a process gas 110 is delivered to a plasma chamber 210. In an operation 1010, the process gas 110 is maintained at a first pressure in the plasma chamber 210. The first pressure can be the same as or up to twice or more multiples of a pressure of a process chamber 230 coupled to a set of outlet ports 220 of the plasma chamber.

In an operation 1015, a primary current $I_p$ is applied to a primary winding 240 wrapped around the external circumference of the plasma chamber 210. In an operation 1020, the primary current $I_p$ generates a magnetic field. In an operation 1025, one or more ferrites 204 concentrate the magnetic field to the approximate center portion of the plasma chamber 210. The ferrites 204 are formed around the plasma chamber 230.

In an operation 1030, the magnetic field induces a secondary current I, in the process gas 110 in the plasma chamber 210. In an operation 1035, the secondary current $I_s$ generates a plasma in the process gas 110 in the plasma chamber 210. In an operation 1040, a portion of the plasma and plasma generated radicals and neutrals pass from the plasma chamber 210 through the plasma chamber outlets 220 and into the process chamber 230.

In an operation 1045, the radicals and neutrals interact with a substrate 102 and the processing chamber 230 to produce plasma byproducts 118 and recombination products 120. In an operation 1050, the plasma byproducts 118 and the recombination products 120 are drawn out of the processing chamber through one or more process outlet ports 304A-304E. The one or more process outlet ports 304A-304E are distributed across the surface of the process chamber top 202 or along the edges of the substrate support 106 or below the substrate support such as in the base of the process chamber or combinations thereof and the method operations can end.

Figure 11:
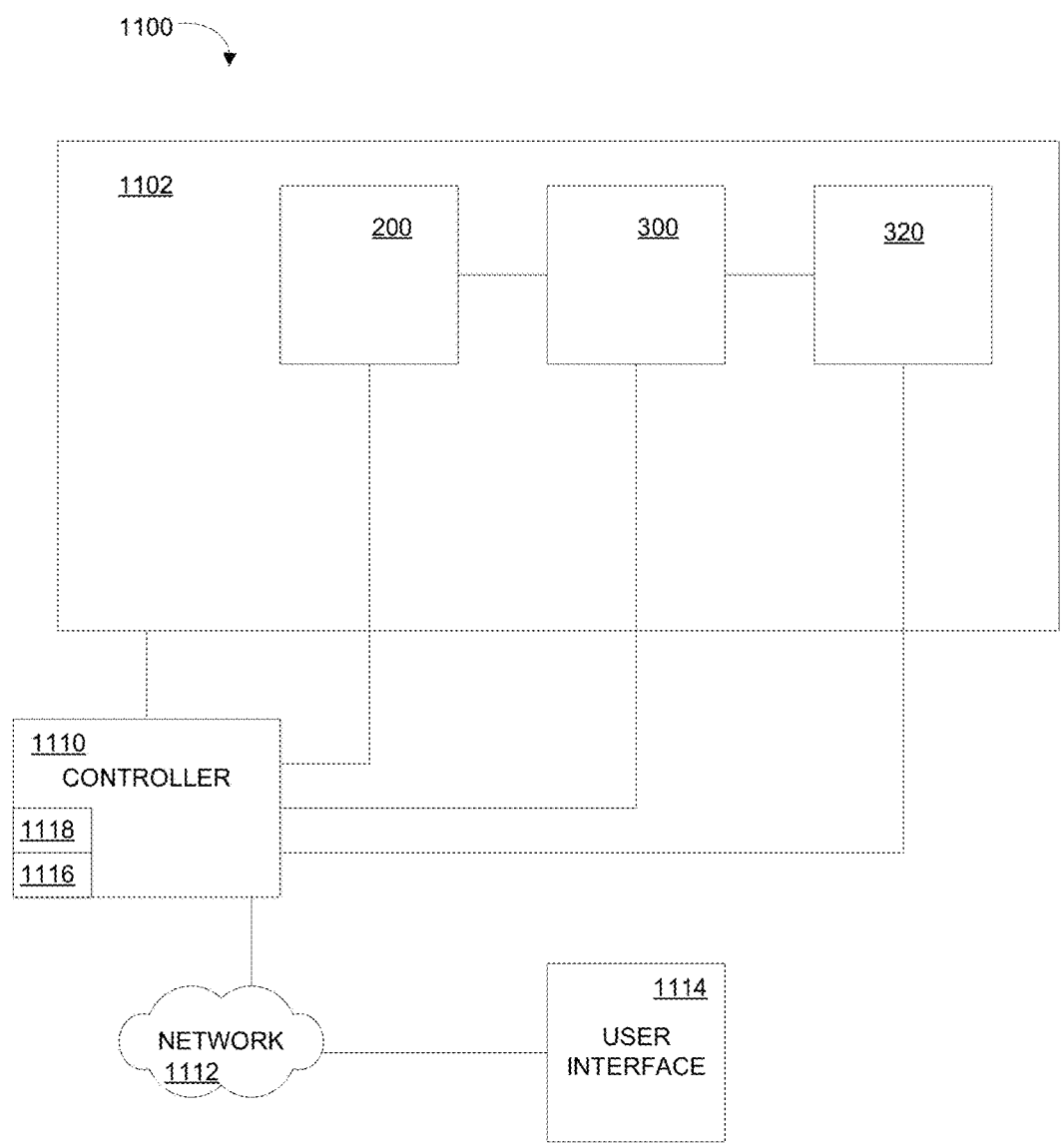
FIG. 11 is a block diagram of an integrated system including one or more of the plasma sources described herein, in accordance with an embodiment of the present invention.

FIG. 11 is a block diagram of an integrated system 1100 including the plasma sources 200, 300, 320, in accordance with an embodiment of the present invention. The integrated system 1100 includes the plasma sources 200, 300, 320, and an integrated system controller 1110 coupled to the plasma sources. The integrated system controller 1110 includes or is coupled to (e.g., via a wired or wireless network 1112) a user interface 1114. The user interface 1114 provides user readable outputs and indications and can receive user inputs and provides user access to the integrated system controller 1110.

The integrated system controller 1110 can include a special purpose computer or a general purpose computer. The integrated system controller 1110 can execute computer programs 1116 to monitor, control and collect and store data 1118 (e.g., performance history, analysis of performance or defects, operator logs, and history, etc.) for the plasma sources 200, 300, 320. By way of example, the integrated system controller 1110 can adjust the operations of the plasma sources 200, 300, 320 and/or the components therein (e.g., the one of the concentric ring plasma chambers 310A-E or ferrites 204, 204A-E, etc.) if data collected dictates an adjustment to the operation thereof.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A plasma system, comprising:
  a plurality of ring plasma chambers including an inner ring plasma chamber and one or more outer ring plasma chambers, each of the plurality of ring plasma chambers having a plurality of gas inlet ports for receiving a process gas and a plurality of gas outlet ports;
  a plurality of primary windings, each of the plurality of primary windings being disposed around a circumference of each of the ring plasma chambers;
  a plurality of ferrites arranged around each one of the plurality of ring plasma chambers, wherein a turn of each of the plurality of primary windings passes through an inside portion of each of the respective plurality of ferrites, and each of the plurality of ferrites is arranged around a cross-section of each one of the plurality of ring plasma chambers; and
  a chamber top for supporting the plurality of ring plasma chambers, the chamber top further including a plurality of outlets coupling to the plurality of gas outlet ports of the plurality of ring plasma chambers to connect to a process chamber disposed below the chamber top, wherein each of the plurality of gas inlet ports and each of the plurality of outlet ports of each of the plurality of ring plasma chambers align with respective ones of the plurality of outlets.

2. The plasma system of claim 1, further comprising,
  a process gas source coupled to each one of the ring plasma chambers.

3. The plasma system of claim 1, wherein the process chamber includes a substrate support for supporting a substrate, the substrate support being disposed below the plurality of outlets.

4. The plasma system of claim 1, further comprising,
  a plurality of plasma restrictions disposed in each of the plurality of outlets to provide a pressure differential between the process chamber and each of the plurality of ring plasma chambers.

5. The plasma system of claim 4, further comprising,
  a bias voltage connected to each of the plurality of plasma restrictions, the bias voltage is configured to draw ions out of the plurality of plasma outlets and into the process chamber.

6. The plasma system of claim 5, wherein each of the plurality of ferrites has a substantial square shape and each of the ring plasma chambers has a rectangular cross-sectional shape.

7. The plasma system of claim 4, wherein each of the plurality of plasma restrictions has a diameter of between about 0.1 mm and about 2.0 mm.

8. The plasma system of claim 1, wherein each of the ring plasma chambers is made from a ceramic material.

9. The plasma system of claim 1, further comprising:
  a power supply for providing a current along the plurality of ferrites via the plurality of primary windings, the plurality of ferrites concentrating the current over the regions of the substrate support.

10. A plasma system, comprising:
  a plurality of ring plasma chambers including an inner ring plasma chamber and one or more outer ring plasma chambers, each of the plurality of ring plasma chambers having a plurality of gas inlet ports for receiving a process gas and a plurality of gas outlet ports;
  a plurality of primary windings, each of the plurality of primary windings being disposed around a circumference of each of the ring plasma chambers;

a plurality of ferrites arranged around each one of the plurality of ring plasma chambers, such that adjacent ones of the plurality of ferrites of each of the plurality of ring plasma chambers have a partial overlap, wherein each turn of each of the plurality of primary windings pass through an inside portion of each of the respective plurality of ferrites and each of the plurality of ferrites is arranged around a cross-section of each of the plurality of ring plasma chambers; and a chamber top for supporting the plurality of ring plasma chambers, the chamber top further including a plurality of outlets coupling to the plurality of gas outlet ports of the plurality of ring plasma chambers to connect to a process chamber disposed below the chamber top, wherein each of the plurality of gas inlet ports and each of the plurality of outlet ports of each of the plurality of ring plasma chambers align with respective ones of the plurality of outlets.

11. The plasma system of claim 10, further comprising, a process gas source coupled to each one of the ring plasma chambers.

12. The plasma system of claim 10, wherein the process chamber includes a substrate support for supporting a substrate, the substrate support being disposed below the plurality of outlets.

13. The plasma system of claim 10, wherein each of the plurality of ferrites has a substantial square shape and each of the ring plasma chambers has a rectangular cross-sectional shape, and each of the ring plasma chambers is made from a ceramic material.

14. The plasma system of claim 10, further comprising:
a power supply for providing a current along the plurality of ferrites via the plurality of primary windings, the plurality of ferrites concentrating the current over the regions of the substrate support.

* * * * *